United States Patent
Noh et al.

(10) Patent No.: US 11,710,741 B2
(45) Date of Patent: *Jul. 25, 2023

(54) SEMICONDUCTOR DEVICES

(71) Applicant: Samsung Electronics Co., Ltd., Suwon-si (KR)

(72) Inventors: Chang Woo Noh, Hwaseong-si (KR); Myung Gil Kang, Suwon-si (KR); Geum Jong Bae, Suwon-si (KR); Dong Il Bae, Seongnam-si (KR); Jung Gil Yang, Hwaseong-si (KR); Sang Hoon Lee, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/243,943

(22) Filed: Apr. 29, 2021

(65) Prior Publication Data

US 2021/0249413 A1 Aug. 12, 2021

Related U.S. Application Data

(63) Continuation of application No. 16/405,174, filed on May 7, 2019, now Pat. No. 11,024,628.

(30) Foreign Application Priority Data

Sep. 19, 2018 (KR) .................... 10-2018-0112214

(51) Int. Cl.
*H01L 27/092* (2006.01)
*H01L 29/78* (2006.01)
(Continued)

(52) U.S. Cl.
CPC ...... *H01L 27/0924* (2013.01); *H01L 21/0337* (2013.01); *H01L 21/823821* (2013.01);
(Continued)

(58) Field of Classification Search
CPC ..... H01L 2029/7858; H01L 21/823412; H01L 21/823418; H01L 21/823807;
(Continued)

(56) References Cited

U.S. PATENT DOCUMENTS 8,778,768 B1 7/2014 Chang et al.
9,984,936 B1 5/2018 Xie et al.
(Continued)

FOREIGN PATENT DOCUMENTS

JP 2005340810 A 12/2005
JP 2018026565 A 2/2018
(Continued)

OTHER PUBLICATIONS

Chiang et al. "Adjustable Stacked Nanowires Device for Low Power Circuit" Research & Development, Taiwan Semiconductor Manufacturing Company, Institute of electronics, National Chiao Tung University. (2 pages).

*Primary Examiner* — Mohammed Shamsuzzaman
(74) *Attorney, Agent, or Firm* — Myers Bigel, P.A.

(57) ABSTRACT

Semiconductor devices are provided. The semiconductor devices may include a first wire pattern extending in a first direction on a substrate and a second wire pattern on the first wire pattern. The second wire pattern may be spaced apart from the first wire pattern and extends in the first direction. The semiconductor devices may also include a first gate structure at least partially surrounding the first wire pattern and the second wire pattern, a second gate structure spaced apart from the first gate structure in the first direction, a first source/drain region between the first gate structure and the second gate structure, a first spacer between a bottom surface of the first source/drain region and the substrate, a
(Continued)

first source/drain contact on the first source/drain region, and a second spacer between the first source/drain contact and the first gate structure.

14 Claims, 17 Drawing Sheets

(51) Int. Cl.
  *H01L 29/66* (2006.01)
  *H01L 21/033* (2006.01)
  *H01L 21/8238* (2006.01)
  *H01L 29/10* (2006.01)
  *H01L 29/08* (2006.01)

(52) U.S. Cl.
  CPC ............... *H01L 21/823828* (2013.01); *H01L 21/823864* (2013.01); *H01L 21/823871* (2013.01); *H01L 29/0847* (2013.01); *H01L 29/1033* (2013.01); *H01L 29/6656* (2013.01); *H01L 29/6681* (2013.01); *H01L 29/66545* (2013.01); *H01L 29/785* (2013.01); *H01L 2029/7858* (2013.01)

(58) Field of Classification Search
  CPC ........... H01L 21/823814; H01L 27/088; H01L 27/092; H01L 29/0653; H01L 29/0673; H01L 29/42392; H01L 29/66772; H01L 29/78654; H01L 29/7848; H01L 29/66439; H01L 29/775; H01L 29/78618; H01L 29/78696; B82Y 10/00
  See application file for complete search history.

(56) References Cited

U.S. PATENT DOCUMENTS

| | | | |
|---|---|---|---|
| 11,024,628 B2* | 6/2021 | Noh | H01L 21/823871 |
| 2007/0145487 A1 | 6/2007 | Kavalieros et al. | |
| 2011/0065244 A1 | 3/2011 | Chang et al. | |
| 2011/0233631 A1 | 9/2011 | Son et al. | |
| 2012/0129311 A1 | 5/2012 | Pal et al. | |
| 2013/0119455 A1 | 5/2013 | Chen et al. | |
| 2014/0151639 A1* | 6/2014 | Chang | H01L 29/0673 257/27 |
| 2015/0303270 A1 | 10/2015 | Liaw | |
| 2016/0240441 A1 | 8/2016 | Kang et al. | |
| 2017/0047400 A1* | 2/2017 | Kim | H01L 29/78696 |
| 2017/0092728 A1 | 3/2017 | Kim et al. | |
| 2017/0092730 A1* | 3/2017 | Kim | B82Y 10/00 |
| 2017/0222006 A1* | 8/2017 | Suh | H01L 29/42392 |
| 2017/0222024 A1* | 8/2017 | Bergendahl | H01L 29/785 |
| 2017/0255735 A1 | 9/2017 | Kim | G06F 30/392 |
| 2017/0263722 A1* | 9/2017 | You | H01L 29/775 |
| 2019/0067113 A1* | 2/2019 | Chiang | H01L 29/0676 |
| 2019/0067121 A1* | 2/2019 | Chiang | H01L 21/02609 |
| 2019/0172841 A1 | 6/2019 | Kishishita | |
| 2019/0206869 A1 | 7/2019 | Kim et al. | |
| 2020/0091152 A1* | 3/2020 | Noh | H01L 21/823871 |

FOREIGN PATENT DOCUMENTS

| | | |
|---|---|---|
| KR | 1020040029582 A | 4/2004 |
| KR | 10-2017-0045616 A | 4/2017 |
| KR | 10-2017-0102660 A | 9/2017 |

* cited by examiner

SEMICONDUCTOR DEVICES

CROSS-REFERENCE TO RELATED APPLICATIONS

This application is a continuation of U.S. patent application Ser. No. 16/405,174, filed May 7, 2019, which claims priority under 35 U.S.C. § 119 to Korean Patent Application No. 10-2018-0112214, filed on Sep. 19, 2018, in the Korean Intellectual Property Office, the disclosure of which is incorporated herein in its entirety by reference.

FIELD

The present disclosure generally relates to the field of electronics and, more particularly, to a semiconductor device.

BACKGROUND

To increase the integration density of semiconductor devices, a multi-gate transistor, a multi-bridge channel element and a nano-sheet element in which a nanowire-shaped silicon body is formed on a substrate and a gate is formed to surround the silicon body have been proposed. Since the multi-gate transistor, the multi-bridge channel element, and the nano-sheet element include three-dimensional channels, scaling down of sizes of semiconductor devices may be relatively easy. Further, the current control capability may be improved without increasing a gate length of the multi-gate transistors.

SUMMARY

According to some embodiments of the present inventive concepts, a semiconductor device may have an improved current control capability by adjusting the number of wire patterns used as a channel region of a transistor.

According to some embodiments of the present inventive concepts, semiconductor devices may include a first wire pattern extending in a first direction on a substrate and a second wire pattern on the first wire pattern. The second wire pattern may be spaced apart from the first wire pattern and extends in the first direction. The semiconductor devices may also include a first gate structure at least partially surrounding the first wire pattern and the second wire pattern, a second gate structure spaced apart from the first gate structure in the first direction, a first source/drain region between the first gate structure and the second gate structure, a first spacer between a bottom surface of the first source/drain region and the substrate, a first source/drain contact on the first source/drain region, and a second spacer between the first source/drain contact and the first gate structure.

According to embodiments of the present inventive concepts, semiconductor devices may include a first wire pattern extending in a first direction on a substrate and a second wire pattern on the first wire pattern. The second wire pattern may be spaced apart from the first wire pattern and may extend in the first direction. The semiconductor devices may also include first, second, and third gate structures that may be spaced apart from each other in the first direction and may at least partially surround the first wire pattern and the second wire pattern and a first source/drain region between the first gate structure and the second gate structure. The first source/drain region may be on the first wire pattern and may extend through the second wire pattern. The semiconductor devices may further include a second source/drain region between the first gate structure and the third gate structure. The second source/drain region may extend through the first and second wire patterns. Additionally, the semiconductor devices may include a first spacer between the first source/drain region and the substrate, a first source/drain contact on the first source/drain region, and a second spacer between the first source/drain contact and the first gate structure. The first spacer may include a material that the second spacer includes.

According to embodiments of the present inventive concepts, semiconductor devices may include a first wire pattern extending in a first direction on a substrate and a second wire pattern on the first wire pattern. The second wire pattern may be spaced apart from the first wire pattern and may extend in the first direction. The semiconductor devices may also include a third wire pattern between the first and second wire patterns. The third wire pattern may be spaced apart from the first and second wire patterns and may extend in the first direction. The semiconductor devices may further include first, second and third gate structures that may be spaced apart from each other in the first direction and may at least partially surround the first, second and third wire patterns and a first source/drain region between the first and second gate structures. The first source/drain region may be on the first wire pattern and may extend through the second and third wire patterns. Additionally, the semiconductor devices may include a second source/drain region between the first and third gate structures, and the second source/drain region may extend through the first, second and third wire patterns. The semiconductor devices may include a first spacer that may least partially surrounding the first wire pattern and may be between a bottom surface of the first source/drain region and the substrate. The second gate structure and the first source/drain region may define a gate structure and a source/drain region of a first transistor, respectively, the third gate structure and the second source/drain region may define a gate structure and a source/drain region of a second transistor, respectively, and the first and second transistors may have an same conductivity type.

The aspects of the present inventive concepts are not limited to those mentioned above and another aspect which is not mentioned may be clearly understood by those skilled in the art from the description below.

BRIEF DESCRIPTION OF THE DRAWINGS

The above and other aspects and features of the present inventive concepts will become more apparent by describing in detail example embodiments thereof with reference to the attached drawings, in which.

DETAILED DESCRIPTION

Figure 1:
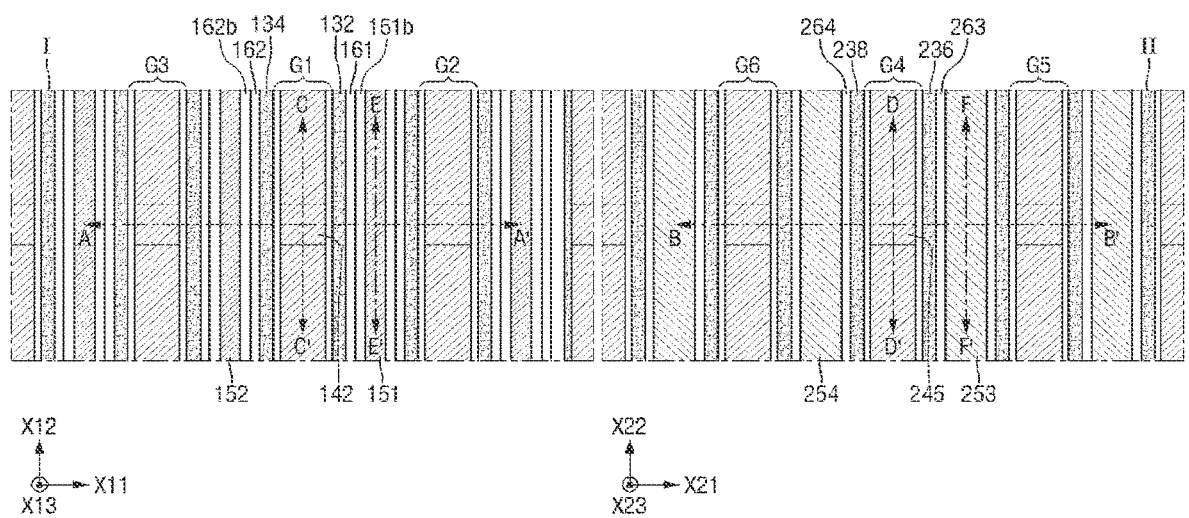
FIG. 1 is a plan view of a semiconductor device according to some embodiments of the present inventive concepts.

Hereinafter, semiconductor devices according to some embodiments of the present inventive concepts will be described with reference to FIGS. 1 to 4. In FIG. 1, for simplicity of illustration, several elements, for example, first and second interlayer insulating films 171 and 172, first, second, third and fourth source/drain contacts 181, 182, 283, and 284, are not illustrated. Referring to FIGS. 1 to 4, a substrate 100 may include a first region I and a second region II. The first and second regions I and II of the substrate 100 may be regions adjacent to each other, or may be regions that are spaced apart from each other. Different types (e.g., different conductivities) of transistors may be formed in the first region I and the second region II of the substrate 100. When a PMOS transistor or an NMOS transistor is formed in the first region I of the substrate 100, an NMOS transistor or a PMOS transistor may be formed in the second region II of the substrate 100.

The substrate 100 may include first and second fin type patterns 149 and 249. For example, the first and second fin type patterns 149 and 249 may be parts of the substrate 100. An upper surface 100U of the substrate 100 may be upper surfaces of each of the first and second fin type patterns 149 and 249.

The field insulating film 105 may surround at least partially side walls of the first and second fin type patterns 149 and 249. The first and second fin type patterns 149 and 249 may be defined by a field insulating film 105. It will be understood that "an element A surrounding an element B in a direction" (or similar language) means that the element A partially or completely surround the element B.

Figure 3:
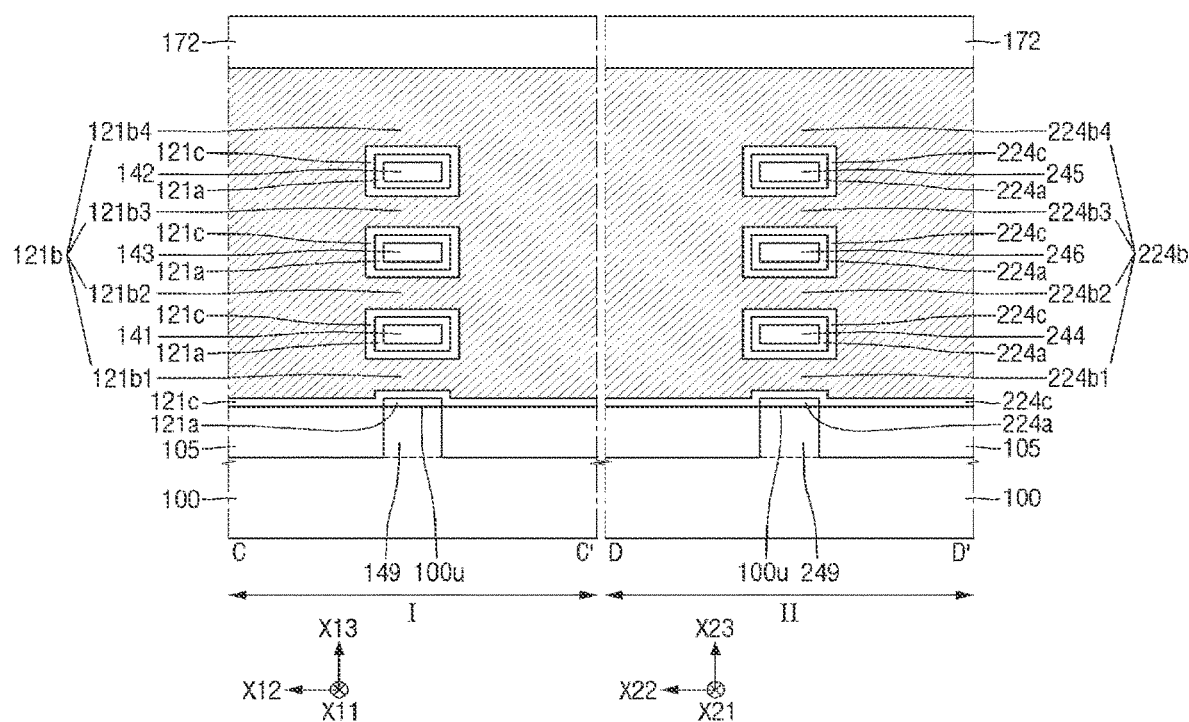
FIG. 3 is a cross-sectional view taken along the lines C-C' and D-D' of FIG. 1 according to some embodiments of the present inventive concepts.
Figure 4:
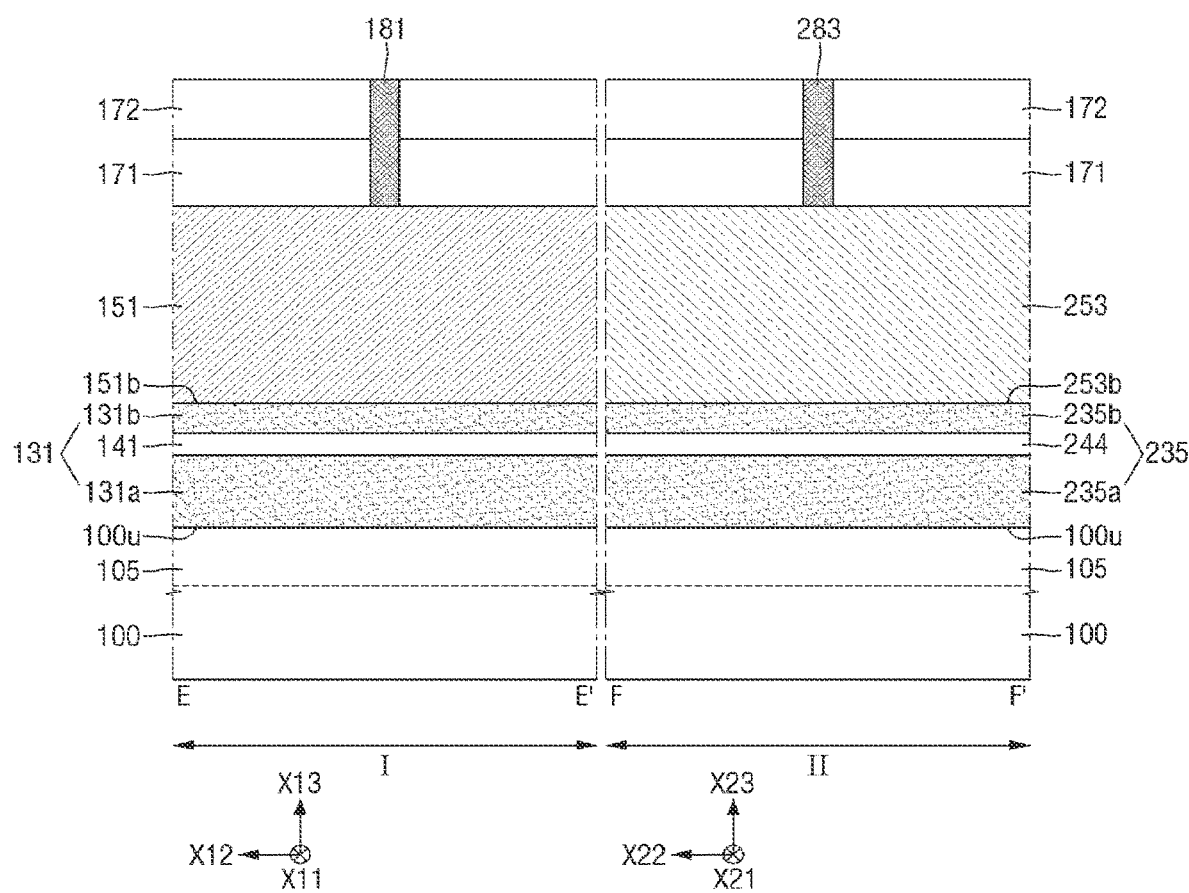
FIG. 4 is a cross-sectional view taken along the lines E-E' and F-F' of FIG. 1 according to some embodiments of the present inventive concepts.

In FIG. 3, the side walls of the first and second fin type patterns 149 and 249 are illustrated as being entirely surrounded by the field insulating film 105, but the present inventive concepts are not limited thereto. Further, in FIG. 3, a height from the substrate 100 to the upper surface of the field insulating film 105 is illustrated as being the same as a height to the upper surfaces of the first and second fin type patterns 149 and 249, but the present inventive concepts are not limited thereto. In some embodiments, the height from the substrate 100 to the upper surface of the field insulating film 105 may be different from the height to the upper surface of the first and second fin type patterns 149 and 249.

The first and second fin type patterns 149 and 249 may be formed by etching a part of the substrate 100 and may include an epitaxial layer that is grown from the substrate 100. The first and second fin type patterns 149 and 249 may include materials the same as or different from the substrate 100. The first and second fin type patterns 149 and 249 may include, for example, silicon or germanium which is an element semiconductor material.

First, second and third wire patterns 141, 142, and 143 may extend in an eleventh direction X11 in the first region I of the substrate 100. The first, second and third wire patterns 141, 142 and 143 may be spaced part from each other in a thirteenth direction X13. The thirteenth direction X13 may be, for example, a direction perpendicular to the upper surface 100U of the substrate 100. The first wire pattern 141 may be spaced apart from the upper surface 100U of the substrate 100. The second wire pattern 142 may be disposed on the first wire pattern 141. The third wire pattern 143 may be disposed between the first and second wire patterns 141 and 142. The fourth, fifth and sixth wire patterns 244, 245, and 246 may extend in a twenty-first direction X21 in the second region II of the substrate 100. The fourth, fifth and sixth wire patterns 244, 245 and 246 may be spaced apart from each other in a twenty-third direction X23. The twenty-third direction X23 may be, for example, a direction perpendicular to the upper surface 100U of the substrate 100. The fourth wire pattern 244 may be spaced apart from the upper surface 100U of the substrate 100. The fifth wire pattern 245 may be disposed on the fourth wire pattern 244. The sixth wire pattern 246 may be disposed between the fourth wire pattern 244 and the fifth wire pattern 245. In FIG. 3, the first to sixth wire patterns 141, 142, 143, 245, 245, and 246 have a square shape, but the present inventive concepts are not limited thereto. In some embodiments, the first to sixth wire patterns 141, 142, 143, 244, 245, and 246 may have rounded corners. The first to third wire patterns 141, 142 and 143 may include the same material as the first fin type pattern 149. The fourth to sixth wire patterns 244, 245 and 246 may include the same material as the second fin type pattern 249. Each of the first to sixth wire patterns 141, 142, 143, 244, 245, and 246 may be used as a channel region of a transistor.

Each of the first, second, and third gate structures G1, G2, and G3 may extend along the twelfth direction X12 in the first region I of the substrate 100, and may be spaced apart from each other in the eleventh direction X11. Each of the fourth, fifth, and sixth gate structures G4, G5, and G6 may extend along a twenty-second direction X22 in the second region II of the substrate 100 and may be spaced apart from each other in the twenty-first direction X21. The twelfth direction X12 may be a direction intersecting the eleventh direction X11. The twenty-second direction X22 may be a direction intersecting the twenty-first direction X21. Each of the first to third gate structures G1, G2, and G3 may surround the first to third wire patterns 141, 142, and 143. Each of the first to third wire patterns 141, 142, and 143 may pass through the first to third gate structures G1, G2, and G3. Each of the fourth to sixth gate structures G4, G5, and G6 may surround the fourth to sixth wire patterns 244, 245, and 246. Each of the fourth to sixth wire patterns 244, 245, and 246 may pass through the fourth to sixth gate structures G4, G5, and G6.

Each of the first to sixth gate structures G1, G2, G3, G4, G5, and G6 may include first to sixth interface films 121a, 122a, 123a, 224a, 225a, and 226a, first to sixth gate electrodes 121b, 122b, 123b, 224b, 225b, and 226b, and first through sixth gate insulating films 121c, 122c, 123c, 224c, 225c, and 226c, respectively. However, the present inventive concepts are not limited thereto, and the first to sixth interface films 121a, 122a, 123a, 224a, 225a, and 226a may be omitted depending on, for example, materials contained in the first to sixth wire patterns 141, 142, 143, 144, 245, and 226. Since the description of the first gate structure G1 may also be applied to the second to sixth gate structures G2, G3, G4, G5 and G6, the first gate structure G1 will be mainly described below.

The first interface film 121a may surround each of the first to third wire patterns 141, 142 and 143. For example, the first interface film 121a may be disposed around each of the first to third wire patterns 141, 142 and 143. The first interface film 121a may be disposed on the first fin type pattern 149. The first interface film 121a may be disposed between the first gate electrode 121b and each of the first to third wire patterns 141, 142 and 143. When the first to third wire patterns 141, 142 and 143 include silicon (Si), the first interface film 121a may include a silicon oxide film ($SiO_2$).

The first gate electrode 121b may surround each of the first to third wire patterns 141, 142 and 143. The first gate electrode 121b may be disposed on the first interface film 121a. The first gate electrode 121b may include first, second, third and fourth portions 121b1, 121b2, 121b3 and 121b4. The first portion 121b1 of the first gate electrode 121b may be disposed between the substrate 100 and the first wire pattern 141. The second portion 121b2 of the first gate electrode 121b may be disposed between the first and third wire patterns 141 and 143. The third portion 121b3 of the first gate electrode 121b may be disposed between the second and third wire patterns 142 and 143. The fourth portion 121b4 of the first gate electrode 121b may be disposed on the second wire pattern 142 between the second and fourth spacers 132 and 134. The first gate electrode 121b may include a conductive material. Although the first gate electrode 121b is illustrated as a single layer, the present inventive concepts are not limited thereto. In some embodiments, the first gate electrode 121b may include a work function conductive layer for adjusting a work function, and a filling conductive layer for filling a space defined by the work function conductive layer for adjusting the work function.

The first gate insulating film 121c may be disposed to surround each of the first to third wire patterns 141, 142 and 143 and may extend between the first interface film 121a and the first gate electrode 121b. The first gate insulating film 121c may be formed between the first gate electrode 121b and the substrate 100, between the first gate electrode 121b and the first spacer 131, between the first gate electrode 121b and the fourth spacer 134, between the first gate electrode 121b and the third spacer 133, and between the first gate electrode 121b and the second spacer 132. The first gate insulating film 121c may include a high-k material having a dielectric constant higher than that of silicon dioxide. As described above, in some embodiments, the first interface film 121a is omitted, and the first gate insulating film 121c may include a silicon oxide film, a silicon oxynitride film or a silicon nitride film as well as the high-k material.

First and second source/drain regions 151 and 152 may be disposed on opposing sides of the first gate structure G1, respectively. The first source/drain region 151 may be disposed between the first and second gate structures G1 and G2. The first source/drain region 151 may pass through, for example, the second and third wire patterns 142 and 143. The first source/drain region 151 may be disposed on the first wire pattern 141. For example, a bottom surface 151b of the first source/drain region 151 may be located on the first wire pattern 141 to be spaced apart from the first wire pattern 141. The first source/drain region 151 may include a lower part 151L between the first and second wire patterns 141 and 142, and an upper part 151U above the second wire pattern 142. The upper part 151U of the first source/drain region 151 may be a part between the lower part 151L of the first source/drain region 151 and the first source/drain contact 181. The second source/drain region 152 may be disposed between the first and third gate structures G1 and G3. The second source/drain region 152 may pass through, for example, the first to third wire patterns 141, 142 and 143. A bottom surface 152b of the second source/drain region 152 may be located in the substrate 100, for example, in the first fin type pattern 149.

The bottom surface 151b of the first source/drain region 151 may be located to be higher than the bottom surface 152b of the second source/drain region 152 on the basis of the upper surface 100U of the substrate 100. A first depth d1 from the upper surface of the first source/drain region 151 to the bottom surface 151b may be smaller than a second depth d2 from the upper surface of the second source/drain region 152 to the bottom surface 152b.

The first source/drain region 151 may overlap, for example, the second and third wire patterns 142 and 143 in the eleventh direction X11. The first source/drain region 151 may not overlap the first wire pattern 141 in the eleventh direction X11. For example, the first source/drain region 151 is in contact with the second and third wire patterns 142 and 143, and may not be in contact with the first wire pattern 141. The second source/drain region 152 may overlap, for example, the first, second and third wire patterns 141, 142 and 143 in the eleventh direction X11. For example, the second source/drain region 152 may be in contact with the first, second and third wire patterns 141, 142 and 143. It will be understood that "an element A overlapping an element B in a direction" (or similar language) means that there is a line that extends in the direction and intersects both the elements A and B.

It will be understood that the present inventive concepts are not limited to the number of wire patterns which the first and second source/drain regions 151 and 152 overlap in the eleventh direction X11. For example, the number of wire patterns which the first source/drain region 151 overlaps in the eleventh direction X11 may be different from the number of wire patterns which the second source/drain region 152 overlaps in the eleventh direction X11.

The third and fourth source/drain regions 253 and 254 may be disposed on opposing sides of the fourth gate structure G4, respectively. The third source/drain region 253 may be disposed between the fourth and fifth gate structures G4 and G5. The third source/drain region 253 may pass through, for example, the fifth and sixth wire patterns 245 and 246. The third source/drain region 253 may be disposed on the fourth wire pattern 244. A bottom surface 253b of the third source/drain region 253 may be located on the fourth wire pattern 244 so as to be spaced apart from the fourth wire pattern 244. The third source/drain region 253 may include a lower part 253L between the fourth and fifth wire patterns 244 and 245, and an upper part 253U above the fifth wire pattern 245. The upper part 253U of the third source/drain region 253 may be a part between the lower part 253L of the third source/drain region 253 and the third source/drain contact 283. The fourth source/drain region 254 may be disposed between the fourth and sixth gate structures G4 and G6. The fourth source/drain region 254 may pass through, for example, the fourth to sixth wire patterns 244, 245 and 246. A bottom surface 254b of the fourth source/drain region 254 may be located in the substrate 100, for example, in the second fin type pattern 249.

The bottom surface 253b of the third source/drain region 253 may be located to be higher than the bottom surface 254b of the fourth source/drain region 254 on the basis of the upper surface 100U of the substrate 100. A third depth d3 from the upper surface of the third source/drain region 253 to the bottom surface 253b may be smaller than a fourth depth d4 from the upper surface of the fourth source/drain region 254 to the bottom surface 254b.

The third source/drain region 253 may overlap, for example, the fifth and sixth wire patterns 245 and 246 in the twenty-first direction X21. The third source/drain region 253 may not overlap the fourth wire pattern 244 in the twenty-first direction X21. For example, the third source/drain region 253 may be in contact with the fifth and sixth wire patterns 245 and 246 and may not be in contact with the fourth wire pattern 244. The fourth source/drain region 254 may overlap, for example, the fourth, fifth and sixth wire patterns 244, 245 and 246 in the twenty-first direction X21. For example, the fourth source/drain region 254 may be in contact with the fourth, fifth and sixth wire patterns 244, 245 and 246.

It will be understood that the present inventive concepts are not limited to the number of wire patterns which the third and fourth source/drain regions 253 and 254 overlap in the twenty-first direction X21. The number of wire patterns which the third source/drain region 253 overlaps in the twenty-first direction X21 may be different from the number of wire patterns which the fourth source/drain region 254 overlaps in the twenty-first direction X21.

In the drawing, each of the first, second, third, and fourth source/drain regions 151, 152, 253 and 254 is illustrated as being formed up to the lower parts of the upper surfaces of the first to fifth gate electrodes 121b, 122b, 123b, 224b, 225b and 226b, but the present inventive concepts are not limited thereto. In some embodiments, the first, second, third, and fourth source/drain regions 151, 152, 253 and 254 may be formed to be higher than the second and fifth wire patterns 142 and 245 that may be used as the channel region.

When the transistor formed in the first region I of the substrate 100 is a PMOS transistor, the first and second source/drain regions 151 and 152 may include compressive stress materials. A compressive stress material may be a material having a lattice constant larger than Si, and may be, for example, SiGe. The compressive stress material may apply a compressive stress to the first and second source/drain regions 151 and 152 to improve the mobility of carriers in the channel region. When the transistor formed in the second region II of the substrate 100 is an NMOS transistor, the third and fourth source/drain regions 253 and 254 may be the same material as the substrate 100 or a tensile stress material. For example, when the substrate 100 is Si, the third and fourth source/drain regions 253 and 254 may be Si or may include a material having a lattice constant smaller than Si (for example, SiC).

The semiconductor device according to the present inventive concepts can improve the current control capability by adjusting the number of wire patterns used as a channel region of a transistor. For example, the first transistor may include the second gate structure G2 and the first source/drain region 151, and the second transistor may include the third gate structure G3 and the second source/drain region 152. In other words, the first transistor may be driven, using the first source/drain region 151 disposed on one side of the second gate structure G2 and the source/drain region disposed on the other side thereof. Further, the second transistor may be driven, using the second source/drain region 152 disposed on the other side of the third gate structure G3, and the second source/drain region disposed on one side thereof. In some embodiments, the number of wire patterns which each of the first and second source/drain regions 151 and 152 overlaps in the eleventh direction X11 may be different. In the first and second transistors of the same type, it is possible to make a current amount of the first transistor different from a current amount of the second transistor by adjusting the number of wire patterns used as a channel region. The descriptions of the first and second transistors may also be applied to a third transistor including a fifth gate structure G5 and a third source/drain region 253, and a fourth transistor including a sixth gate structure G6 and a fourth source/drain region 254.

A first spacer 131 may be disposed between the bottom surface 151b of the first source/drain region 151 and the first region I of the substrate 100. The first spacer 131 may surround the first wire pattern 141. The first spacer 131 may be in contact with the first and second gate structures G1 and G2. The first spacer 131 may include first and second portions 131a and 131b. The first portion 131a of the first spacer 131 may be a portion between the substrate 100 and the first wire pattern 141. The second portion 131b of the first spacer 131 may be a portion between the first wire pattern 141 and the first source/drain region 151. The second portion 131b of the first spacer 131 may include a portion between the first source/drain region 151 and the first gate structure G1, and between the first source/drain region 151 and the second gate structure G2. For example, the second portion 131b of the first spacer 131 may define the bottom surface 151b of the first source/drain region 151. On the other hand, no spacer may be placed between the second source/drain region 152 and the substrate 100.

Second and fourth spacers 132 and 134 may be disposed on side walls of the fourth portion 121b4 of the first gate electrode 121b, respectively. The second spacer 132 may be disposed between the first source/drain contact 181 and the first gate structure G1. The second spacer 132 may be disposed between the first source/drain contact 181 and the fourth portion 121b4 of the first gate electrode 121b. The second spacer 132 may be disposed between the upper part 151U of the first source/drain region 151 and the fourth portion 121b4 of the first gate electrode 121b. The second spacer 132 may be disposed on the second wire pattern 142. The fourth spacer 134 may be disposed between the second source/drain contact 182 and the first gate structure G1. The fourth spacer 134 may be interposed between the second source/drain region 152 and the first gate structure G1. For example, the fourth spacer 134 may be interposed between the second source/drain region 152 and the first portion 121b1 of the first gate electrode 121b, between the second source/drain region 152 and the second portion 121b2 of the first gate electrode 121b, between the second source/drain region 152 and the third portion 121b3 of the first gate electrode 121b, and between the second source/drain region 152 and the fourth portion 121b4 of the first gate electrode 121b. The fourth spacer 134 may surround each of the first, second and third wire patterns 141, 142 and 143.

A third spacer 133 may be disposed between the first source/drain region 151 and the first gate structure G1. For example, the third spacer 133 may be interposed between the third portion 121b3 of the first gate electrode 121b and the lower part 151L of the first source/drain region 151. In addition, the third spacer 133 may be disposed between the first wire pattern 141 and the second wire pattern 142. For example, the second wire pattern 142 may be interposed between the second and third spacers 132 and 133. For example, the third spacer 133 may be in contact with the first source/drain region 151 and the first gate insulating film 121c between the second wire pattern 142 and the third wire pattern 143.

A fifth spacer 235 may be disposed between the bottom surface 253b of the third source/drain region 253 and the second region II of the substrate 100. The fifth spacer 235 may surround the fourth wire pattern 244. The fifth spacer 235 may be in contact with, for example, the fourth and fifth gate structures G4 and G5. The fifth spacer 235 may include first and second portions 235a and 235b. The first portion 235a of the fifth spacer 235 may be a portion disposed between the substrate 100 and the fourth wire pattern 244. The second portion 235b of the fifth spacer 235 may be a portion disposed between the fourth wire pattern 244 and the third source/drain region 253. The second portion 235b of the fifth spacer 235 may include a portion between the third source/drain region 253 and the fourth gate structure G4 and between the third source/drain region 253 and the fifth gate structure G5. For example, the second portion 235b of the fifth spacer 235 may define the bottom surface 253b of the third source/drain region 253. On the other hand, no spacer may be placed between the fourth source/drain region 254 and the substrate 100.

A sixth spacer 236 and an eighth spacer 238 may be disposed on both side walls of the fourth portion 224b4 of the fourth gate electrode 224b. The sixth spacer 236 may be disposed between the third source/drain contact 283 and the fourth gate structure G4. The sixth spacer 236 may be disposed between the third source/drain contact 283 and the fourth portion 224b4 of the fourth gate electrode 224b. The sixth spacer 236 may be disposed between the upper part 253U of the third source/drain region 253 and the fourth portion 224b4 of the fourth gate electrode 224b. The sixth spacer 236 may be disposed on the fifth wire pattern 245. For example, the sixth spacer 236 may also be disposed between the eleventh spacer 263 and the fifth wire pattern 245. The eighth spacer 238 may be disposed between the fourth source/drain contact 284 and the fourth gate structure G4. The eighth spacer 238 may be interposed between the fourth source/drain region 254 and the fourth gate structure G4. For example, the eighth spacer 238 may be interposed between the fourth source/drain region 254 and the first portion 224b1 of the fourth gate electrode 224b, between the fourth source/drain region 254 and the second portion 224b2 of the fourth gate electrode 224b, between the fourth source/drain region 254 and the third portion 224b3 of the fourth gate electrode 224b, and between the fourth source/drain region 254 and the fourth portion 224b4 of the fourth gate electrode 224b. The eighth spacer 238 may surround each of the fourth, fifth and sixth wire patterns 244, 245 and 246.

The seventh spacer 237 may be disposed between the third source/drain region 253 and the fourth gate structure G4. For example, the seventh spacer 237 may be interposed between the third portion 224b3 of the fourth gate electrode 224b and the lower part 253L of the third source/drain region 253. Further, the seventh spacer 237 may be disposed between the fifth and sixth wire patterns 245 and 246. For example, the seventh spacer 237 may be in contact with each of the third source/drain region 253, and the fourth gate insulating film 224c between the fifth wire pattern 245 and the sixth wire pattern 246.

In some embodiments, the first to eighth spacers 131, 132, 133, 134, 235, 236, 237 and 238 may contain the same material. For example, the first to eighth spacers 131, 132, 133, 134, 235, 236, 237 and 238 may include at least one of silicon nitride (SiN), silicon oxynitride (SiON), silicon oxide (SiO$_2$), silicon oxycarbonitride (SiOCN), and combinations thereof.

In some embodiments of the present inventive concepts, the first, second and fourth spacers 131, 132 and 134 may include the same material. Further, the first spacer 131 may be disposed under the first source/drain region 151. In some embodiments, the first and second source/drain regions 151 and 152 may be formed after forming the first to fourth spacers 131, 132, 133 and 134, and the second and fourth spacers 131, 132 and 134 may contain the same material. In some embodiments, the first spacer 131 may be disposed under the first source/drain region 151 as the first source/drain region 151 is formed after the first spacer 131 is formed.

It will be understood that if the first and second source/drain regions 151 and 152 are formed after the first to fourth spacers 131, 132, 133 and 134 are formed, the channel region (e.g., the first, second and third wire patterns 141, 142 and 143) may not be exposed while forming the first and second source/drain regions 151 and 152. It will be also understood that if the third and fourth source/drain regions 253 and 254 are formed after the fifth to eighth spacers 235, 236, 237 and 238 are formed, the channel region (e.g., the fourth, fifth and sixth wire patterns 244, 245 and 246) may not be exposed while forming the third and fourth source/drain regions 253 and 254.

A ninth spacer 161 may be disposed between the second spacer 132 and the first source/drain contact 181. The ninth spacer 161 may be disposed on the side wall of the second spacer 132. The ninth spacer 161 may be disposed on the first source/drain region 151. The ninth spacer 161 may include an extending portion 161b. The extending portion 161b of the ninth spacer 161 may be a portion extending along the upper surface of the first source/drain region 151. However, the present inventive concepts are not limited to the configuration in which the ninth spacer 161 includes the extending portion 161b. In some embodiments, depending on the process, the extending portion 161b of the ninth spacer 161 may be omitted by, for example, being removed when forming the first source/drain contact 181.

A tenth spacer 162 may be disposed between the fourth spacer 134 and the second source/drain contact 182. The tenth spacer 162 may be disposed on the side wall of the fourth spacer 134. The tenth spacer 162 may be disposed on the second source/drain region 152. The tenth spacer 162 may include an extending portion 162b. The extending portion 162b of the tenth spacer 162 may be a portion extending along the upper surface of the second source/drain region 152. However, the present inventive concepts are not limited to the configuration in which the tenth spacer 162 includes the extending portion 162b. In some embodiments, depending on the process, the extending portion 162b of the tenth spacer 162 may be omitted by, for example, being removed when forming the second source/drain contact 182.

An eleventh spacer 263 may be disposed between the sixth spacer 236 and the third source/drain contact 283, and between the third source/drain region 253 and the sixth spacer 236. The eleventh spacer 263 may be disposed on the side wall of the sixth spacer 236. The twelfth spacer 264 may be disposed between the eighth spacer 238 and the fourth source/drain contact 284, and between the fourth source/drain region 254 and the eighth spacer 238. The twelfth spacer 264 may be disposed on the side wall of the eighth spacer 238.

In some embodiments, the ninth to twelfth spacers 161, 162, 263 and 264 may include the same materials as those of the first to eighth spacers 131, 132, 133, 134, 235, 236, 237 and 238. In some embodiments, the ninth to twelfth spacers 161, 162, 263 and 264 may include materials having dielectric constant different from those of the first to eighth spacers 131, 132, 133, 134, 235, 236, 237 and 238. For example, the first to eighth spacers 131, 132, 133, 134, 235, 236, 237 and 238 may also include the materials having the dielectric constant smaller than those of the materials included in the ninth to twelfth spacers 161, 162, 263 and 264, and thus the parasitic capacitance between each gate electrode and the source/drain region may be reduced. When the first to eighth spacers 131, 132, 133, 134, 235, 236, 237 and 238 include the materials having the dielectric constant smaller than those of the materials included in the ninth to twelfth spacers 161, 162, 263 and 264, the first to eighth spacers 131, 132, 133, 134, 235, 236, 237 and 238 may include, for example, at least one of a low dielectric constant dielectric material, SiN, SiCN, SiON, SiBN, SiOCN, SiBCN, SiOC, and combinations thereof. The low dielectric constant dielectric material may be a material having a dielectric constant lower than that of silicon dioxide.

The first interlayer insulating film 171 may surround each side wall of the ninth to twelfth spacers 161, 162, 263, and 264, on the first, second, third, and fourth source/drain regions 151, 152, 253 and 254. The second interlayer insulating film 172 may be disposed on the first interlayer insulating film 171 to cover the first to fifth gate structures G1, G2, G3, G4 and G5, and the upper surfaces of the second, fourth, sixth, eighth, and ninth to twelfth spacers 132, 134, 236, 238, 161, 162, 263 and 264. The first and second interlayer insulating films 171 and 172 may include, for example, at least one of a low dielectric constant material, an oxide film, a nitride film, and an oxynitride film.

Each of the first to fourth source/drain contacts 181, 182, 283 and 284 may be disposed on each of the first to fourth source/drain regions 151, 152, 253 and 254. The first source/drain contact 181 may pass through the first interlayer insulating film 171, the second interlayer insulating film 172 and the ninth spacer 161, and may be in direct contact with the first source/drain region 151. The second source/drain contact 182 may pass through the first interlayer insulating film 171, the second interlayer insulating film 172, and the tenth spacer 162, and may be in direct contact with the second source/drain region 152. Each of the third and fourth source/drain contacts 283 and 284 may pass through the first interlayer insulating film 171 and the second interlayer insulating film 172, and may be in direct contact with each of the third and the fourth source/drain regions 253 and 254.

In the drawings, the first, second, third and fourth source/drain contacts 181, 182, 283 and 284 are illustrated as a single film, but the present inventive concepts are not limited thereto. In some embodiments, each of the first, second, third and fourth source/drain contacts 181, 182, 283 and 284 may include multiple layers including, for example, a barrier film.

Hereinafter, a semiconductor device according to some embodiments of the present inventive concepts will be described with reference to FIGS. 1, 3, 4, and 5. For simplicity of description, repeated description will be simplified or omitted. Referring to FIGS. 1, 3, 4, and 5, between the first and second wire patterns 141 and 142, the first source/drain region 151 may be in direct contact with each of the first and second gate structures G1 and G2, and the second source/drain region 152 may be in direct contact with each of the first and third gate structures G1 and G3. Elements of the second region II of the substrate 100 of FIG. 5 may be the same as or similar to those of the second region II of the substrate 100 of FIG. 2.

The first source/drain region 151 may include a first side wall 151S1 and a second side wall 151S2. The first side wall 151S1 of the first source/drain region 151 may be in direct contact with the first gate structure G1. For example, the first side wall 151S1 of the first source/drain region 151 may be in direct contact with the first gate electrode 121b, the first interface film 121a, and the first gate insulating film 121c. For example, between the first and second source/drain regions 151 and the first gate structure G1, no spacer may be disposed between the second and third wire patterns 142 and 143. That is to say, the third spacer 133 described referring to FIG. 2 may not be disposed. In this case, an epitaxial process for forming the first source/drain region 151 may proceed smoothly. The second side wall 151S2 of the first source/drain region 151 may be in direct contact with the second gate structure G2. For example, the second side wall 151S2 of the first source/drain region 151 may be in direct contact with the second gate electrode 122b, the second interface film 122a, and the second gate insulating film 122c. For example, between the second and third wire patterns 142 and 143, no spacer may be disposed between the first source/drain region 151 and the second gate structure G2.

The second source/drain region 152 may include a first side wall 152S1 and a second side wall 152S2. The first side wall 152S1 of the second source/drain region 152 may be in direct contact with the third gate structure G3. For example, the first side wall 152S1 of the second source/drain region 152 may be in direct contact with the third gate electrode 123b, the third interface film 123a, and the third gate insulating film 123c. For example, between the first and third wire patterns 141 and 143 and between the second and third wire patterns 142 and 143, no spacer may be disposed between the second source/drain region 152 and the third the gate structure G3. The second side wall 152S2 of the second source/drain region 152 may be in direct contact with the first gate structure G1. For example, the second side wall 152S2 of the second source/drain region 152 may be in direct contact with the first gate electrode 121b, the first interface film 121a, and the first gate insulating film 121c. For example, between the first and third wire patterns 141 and 143 and between the second and third wire patterns 142 and 143, no spacer may be disposed between the second source/drain region 152 and the first gate structure G1. However, the third spacer 134 may be disposed between the fourth portion 121b4 of the first gate electrode 121b and the second source/drain region 152, and between the fourth portion 121b4 of the first gate electrode 121b and the second source/drain contact 182.

In the drawings, each of the side walls 151S1, 151S2, 152S1, and 152S2 is illustrated as being a curved line, but the present inventive concepts are not limited thereto. In some embodiments, depending on processes, the side walls 151S1, 151S2, 152S1, and 152S2 may have various shapes.

Hereinafter, a semiconductor device according to some embodiments of the present inventive concepts will be described with reference to FIGS. 1, 3, 4, and 6. Repeated description will be simplified or omitted for simplicity of description. Referring to FIGS. 1, 3, 4, and 6, between the fourth wire pattern 244 and the fifth wire pattern 245, the third source/drain region 253 may be in direct contact with each of the fourth and fifth gate structures G4 and G5, and the fourth source/drain region 254 may be in direct contact with each of the fourth and sixth gate structures G4 and G6. Elements in the first region I of the substrate 100 of FIG. 6 may be the same as or similar to those in the first region I of the substrate 100 of FIG. 2.

The third source/drain region 253 may include a first side wall 253S1 and a second side wall 253S2. The first side wall 253S1 of the third source/drain region 253 may be in direct contact with the fourth gate structure G4. For example, the first side wall 253S1 of the third source/drain region 253 may be in direct contact with the fourth gate electrode 224b, the fourth interface film 224a and the fourth gate insulating film 224c. For example, between the fifth and sixth wire patterns 245 and 246, no spacer may be disposed between the third source/drain region 253 and the fourth gate structure G4. For example, the seventh spacer 237 described referring to FIG. 2 may not be disposed. The second side wall 253S2 of the third source/drain region 253 may be in direct contact with the fifth gate structure G5. For example, the second side wall 253S2 of the third source/drain region 253 may be in direct contact with the fifth gate electrode 225b, the fifth interface film 225a and the fifth gate insulating film 245c. For example, between the fifth and sixth wire patterns 245 and 246, no spacer may be disposed between the third source/drain region 253 and the fifth gate structure G5.

The fourth source/drain region 254 may include a first side wall 254S1 and a second side wall 254S2. The first side wall 254S1 of the fourth source/drain region 254 may be in direct contact with the sixth gate structure G6. For example, the first side wall 254S1 of the fourth source/drain region 254 may be in direct contact with the sixth gate electrode 226b, the sixth interface film 226a and the sixth gate insulating film 226c. For example, between the fourth and sixth wire patterns 244 and 246, and between the fifth and sixth wire patterns 245 and 246, no spacer may be disposed between the fourth source/drain region 254 and the sixth gate structure G6. The second side wall 254S2 of the fourth source/drain region 254 may be in direct contact with the fourth gate structure G4. For example, the second side wall 254S2 of the fourth source/drain region 254 may be in direct contact with the fourth gate electrode 224b, the fourth interface film 224a and the fourth gate insulating film 224c. For example, between the fourth and sixth wire patterns 244 and 246, and between the fifth and sixth wire patterns 245 and 246, no spacer may be disposed between the fourth source/drain region 254 and the fourth gate structure G4. However, the eighth spacer 238 may be disposed between the fourth portion 224b4 of the fourth gate electrode 224b and the fourth source/drain region 254, and between the fourth portion 224b4 of the fourth gate electrode 224b and the fourth source/drain contact 284.

Hereinafter, a semiconductor device according to some embodiments of the present inventive concepts will be described with reference to FIGS. 1, 3, 4 and 7. Repeated description will be simplified or omitted for simplicity of description. Referring to FIGS. 1, 3, 4, and 7, between the first wire pattern 141 and the second wire pattern 142, the first source/drain region 151 may be in direct contact with each of the second gate structures G1 and G2, and the second source/drain region 152 may be in direct contact with each of the first and third gate structures G1 and G3. Between the fourth wire pattern 244 and the fifth wire pattern 245, the third source/drain region 253 may be in direct contact with each of the fourth and fifth gate structures G4 and G5, and the fourth source/drain region 254 may be in direct contact with each of the fourth and sixth gate structures G4 and G6.

Figure 5:
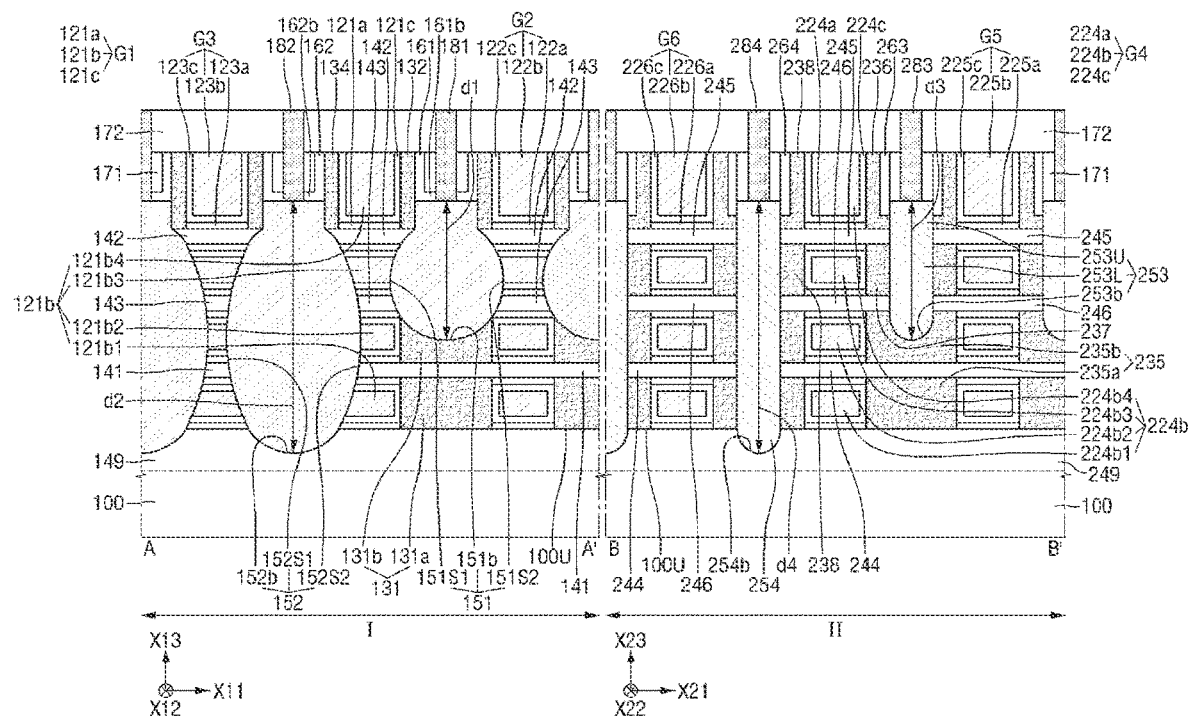
FIGS. 5, 6, and 7 are cross-sectional views taken along the lines A-A' and B-B' of FIG. 1 according to some embodiments of the present inventive concepts.
Figure 6:
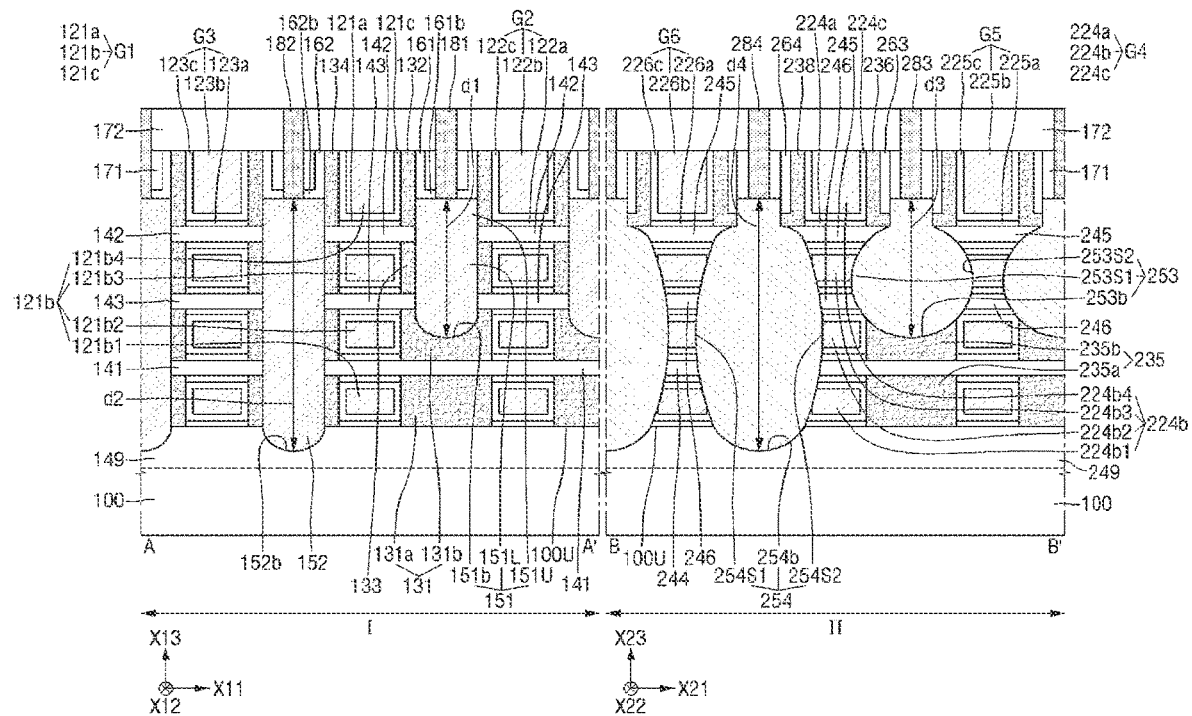
Figure 7:
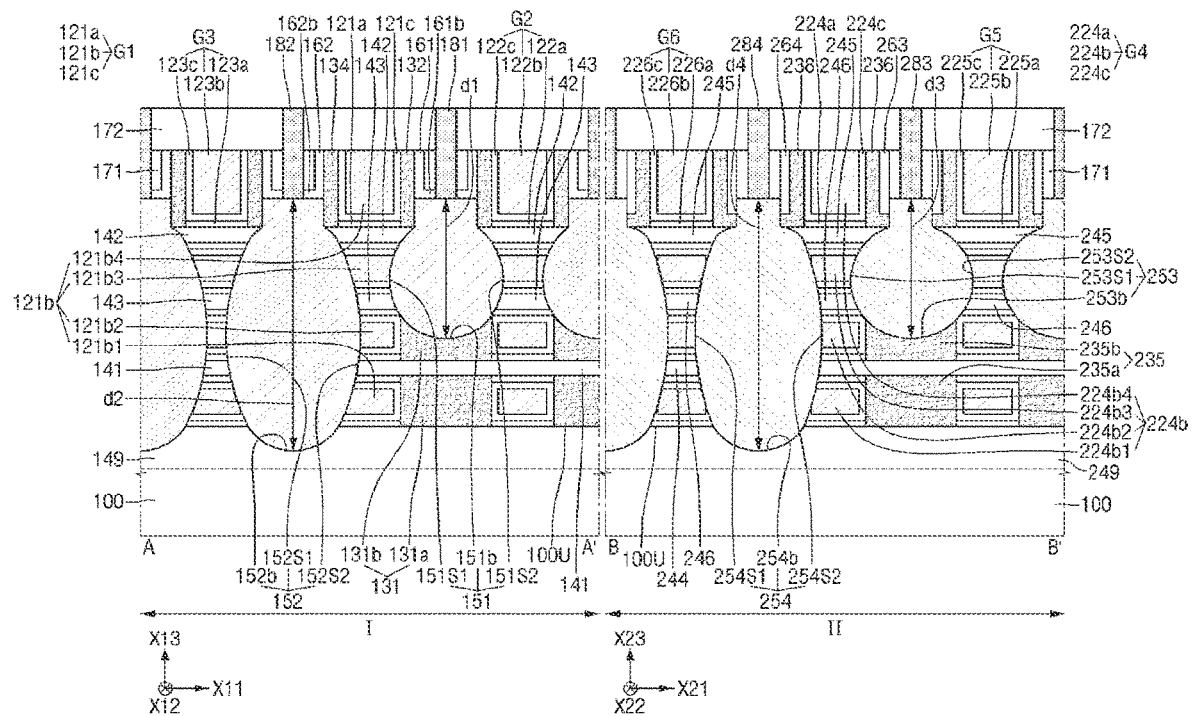

Elements in the first region I of the substrate 100 of FIG. 7 may be the same as or similar to those in the first region I of the substrate 100 of FIG. 5. Elements in the second region II of the substrate 100 of FIG. 7 may be the same as or similar to those in the second region II of the substrate 100 of FIG. 6.

Figure 8:
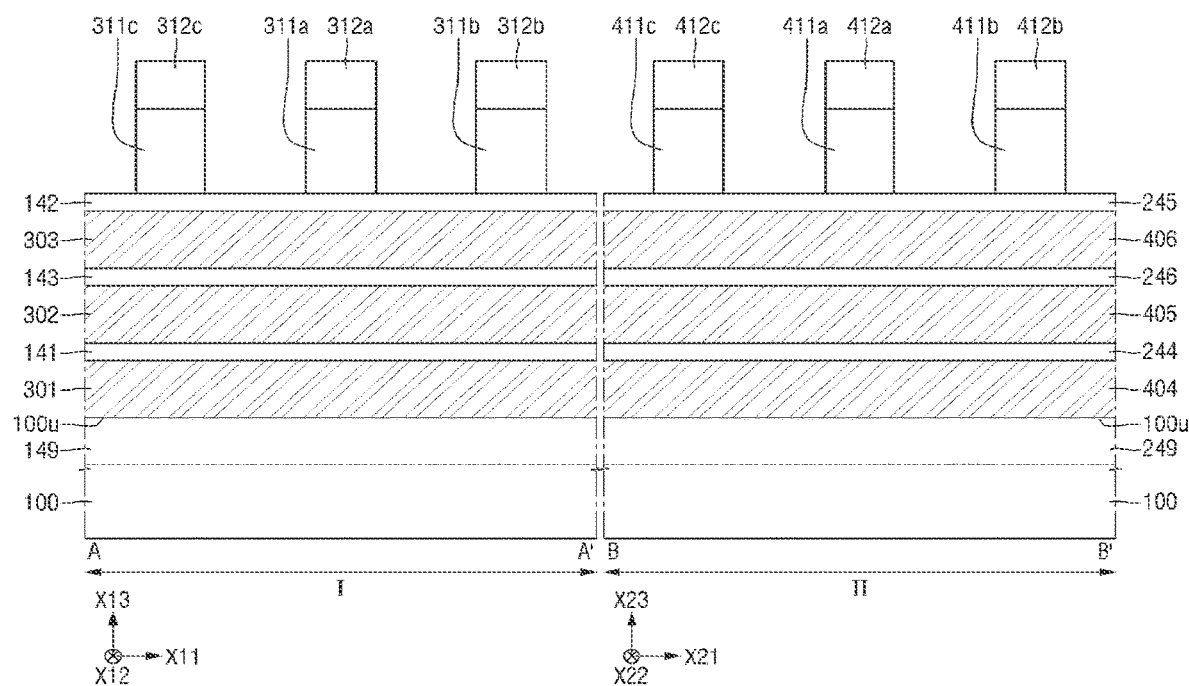
FIGS. 8 to 17 are cross-sectional views illustrating a method of fabricating a semiconductor device according to some embodiments of the present inventive concepts.

Hereinafter, a method for fabricating a semiconductor device according to some embodiments of the present inventive concepts will be described with reference to FIGS. 8 to 17. Repeated description will be simplified or omitted for simplicity of description. Referring to FIG. 8, a first sacrificial film 301, a first wire pattern 141, a second sacrificial film 302, a third wire pattern 143, a third sacrificial film 303, and a second wire pattern 142 may be sequentially stacked on the first region I of the substrate 100. A fourth sacrificial film 404, a fourth wire pattern 244, a fifth sacrificial film 405, a sixth wire pattern 246, a sixth sacrificial film 406, and a fifth wire pattern 245 may be sequentially stacked on the second region II of the substrate 100. The first, second, and third dummy gate electrodes 311a, 311b and 311c may be disposed on the second wire pattern 142 to be spaced apart from each other. Each of first, second and third hard masks 312a, 312b and 312c may be disposed on each of the first to third dummy gate electrodes 311a, 311b and 311c. Fourth, fifth, and sixth dummy gate electrodes 411a, 411b and 411c may be disposed on the fifth wire pattern 245 to be spaced apart from each other. Fourth, fifth and sixth hard masks 412a, 412b and 412c may be disposed on each of the fourth to sixth dummy gate electrodes 411a, 411b and 411c. The first to sixth sacrificial films 301, 302, 303, 404, 405, and 406 may include, for example, silicon germanium (SiGe), but the present inventive concepts are not limited thereto. For example, the first to sixth sacrificial films 301, 302, 303, 404 and 405, 406 may include materials having an etching selectivity with respect to the first to sixth wire patterns 141, 142, 143, 244, 245 and 246.

Figure 9:
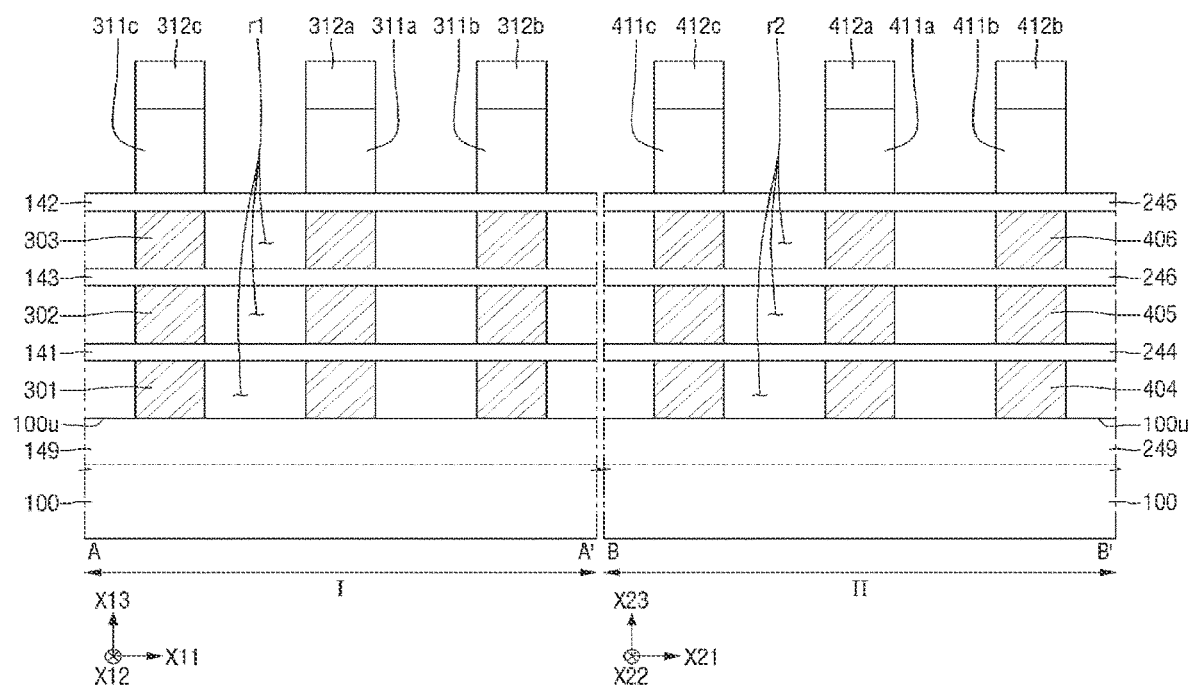

Referring to FIG. 9, some parts of the first, second and third sacrificial films 301, 302 and 303 may be removed in the first region I of the substrate 100 to form a first recess r1. The first recess r1 may be formed by selectively removing portions of the first to third sacrificial films 301, 302 and 303. The first recess r1 may be formed by removal of the portions of the first to third sacrificial films 301, 302 and 303 which do not overlap the first to third dummy gate electrodes 311a, 311b and 311c and the first to third hard masks 312a, 312b and 312c in the thirteenth direction X13. A second recess r2 may be formed by removal of some parts of the fourth, fifth and sixth sacrificial films 404, 405 and 406 in the second region II of the substrate 100. The second recess r2 may be formed by selectively removing portions of the fourth to sixth sacrificial films 404, 405 and 406. The second recess r2 may be formed by removal of the portions of the fourth to sixth sacrificial films 404, 405 and 406 which do not overlap the fourth to sixth dummy gate electrodes 411a, 411b and 411c and the fourth to sixth hard masks 412a, 412b and 412c in the twenty-third direction X23.

Figure 10:
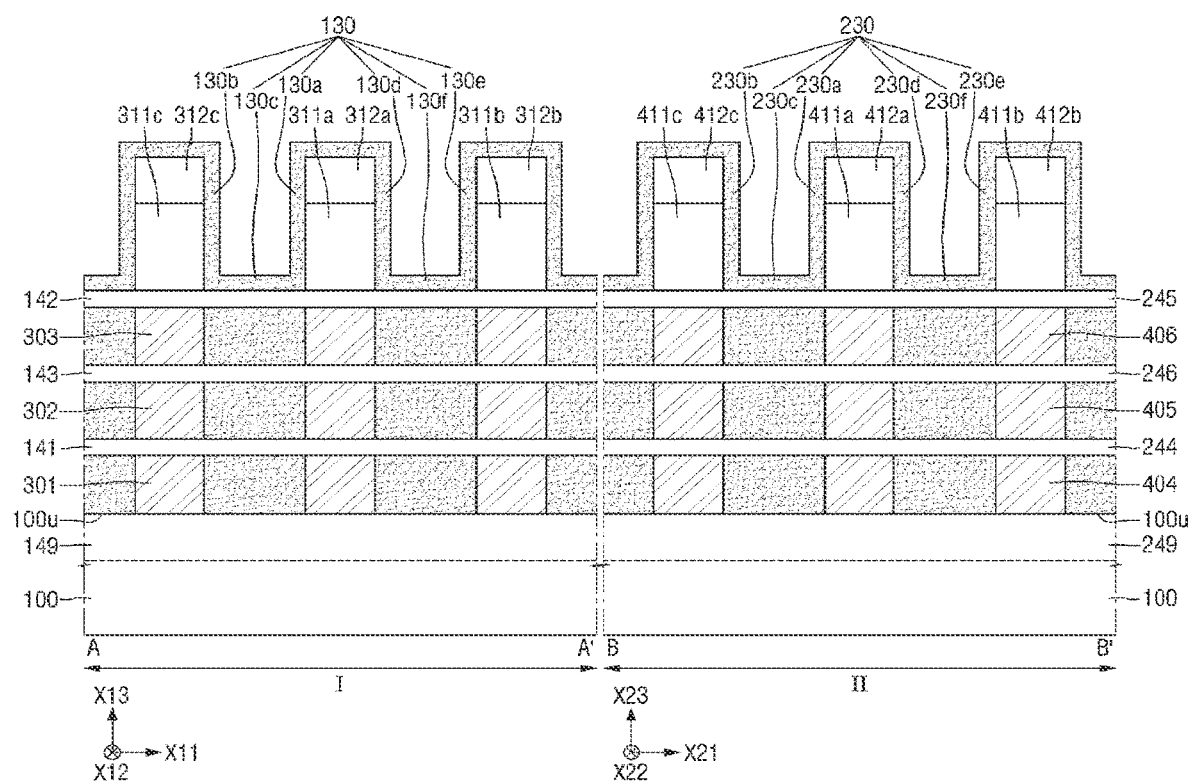

Referring to FIG. 10, the first spacer material 130 may fill the first recess r1. It will be understood that "an element A filing an element B" (or similar language) means that the element A partially fill or completely fill the element B. The first spacer material 130 may also be formed on the second wire pattern 142. The first spacer material 130 may be formed on side walls of each of the first to third dummy gate electrodes 311a, 311b and 311c. The first spacer material 130 may be formed on the upper surfaces and side walls of each of the first to third hard masks 312a, 312b and 312c. The first spacer material 130 may include first to sixth portions 130a, 130b, 130c, 130d, 130e and 130f. The first portion 130a of the first spacer material 130 may be a portion formed on one side wall of the first dummy gate electrode 311a and one side wall of the first hard mask 312a. The second portion 130b of the first spacer material 130 may be a portion formed on the other side wall of the third dummy gate electrode 311c and the other side wall of the third hard mask 312c. The third portion 130c of the first spacer material 130 may be a portion that extends along the upper surface of the second wire pattern 142 between the first and second portions 130a and 130b. The fourth portion 130d of the first spacer material 130 may be a portion formed on the other side wall of the first dummy gate electrode 311a and the other side wall of the first hard mask 312a. The fifth portion 130e of the first spacer material 130 may be a portion formed on one side wall of the second dummy gate electrode 311b and one side wall of the second hard mask 312b. The sixth portion 130f of the first spacer material 130 may be a portion that extends along the upper surface of the second wire pattern 142 between the fourth and fifth portions 130d and 130e.

The second spacer material 230 may fill the second recess r2. The second spacer material 230 may be formed on the fifth wire pattern 245. The second spacer material 230 may be formed on side walls of each of the fourth to sixth dummy gate electrodes 411a, 411b and 411c. The second spacer material 230 may be formed on the upper surfaces and side walls of each of the fourth to sixth hard masks 412a, 412b and 412c.

The second spacer material 230 may include first to sixth portions 230a, 230b, 230c, 230d, 230e and 230f. The first portion 230a of the second spacer material 230 may be a portion formed on one side wall of the fourth dummy gate electrode 411a and one side wall of the fourth hard mask 412a. The second portion 230b of the second spacer material 230 may be a portion formed on the other side wall of the sixth dummy gate electrode 411c and the other side wall of the sixth hard mask 412c. The third portion 230c of the second spacer material 230 may be a portion that extends along the upper surface of the fifth wire pattern 245 between the first and second portions 230a and 230b. The fourth portion 230d of the second spacer material 230 may be a portion formed on the other side wall of the fourth dummy gate electrode 411a and the other side wall of the fourth hard mask 412b. The fifth portion 230e of the second spacer material 230 may be a portion formed on one side wall of the fifth dummy gate electrode 411b and one side wall of the fifth hard mask 412b. The sixth portion 230f of the first spacer material 130 may be a portion that extends along the upper surface of the fifth wire pattern 245 between the fourth and fifth portions 230d and 230e.

Figure 2:
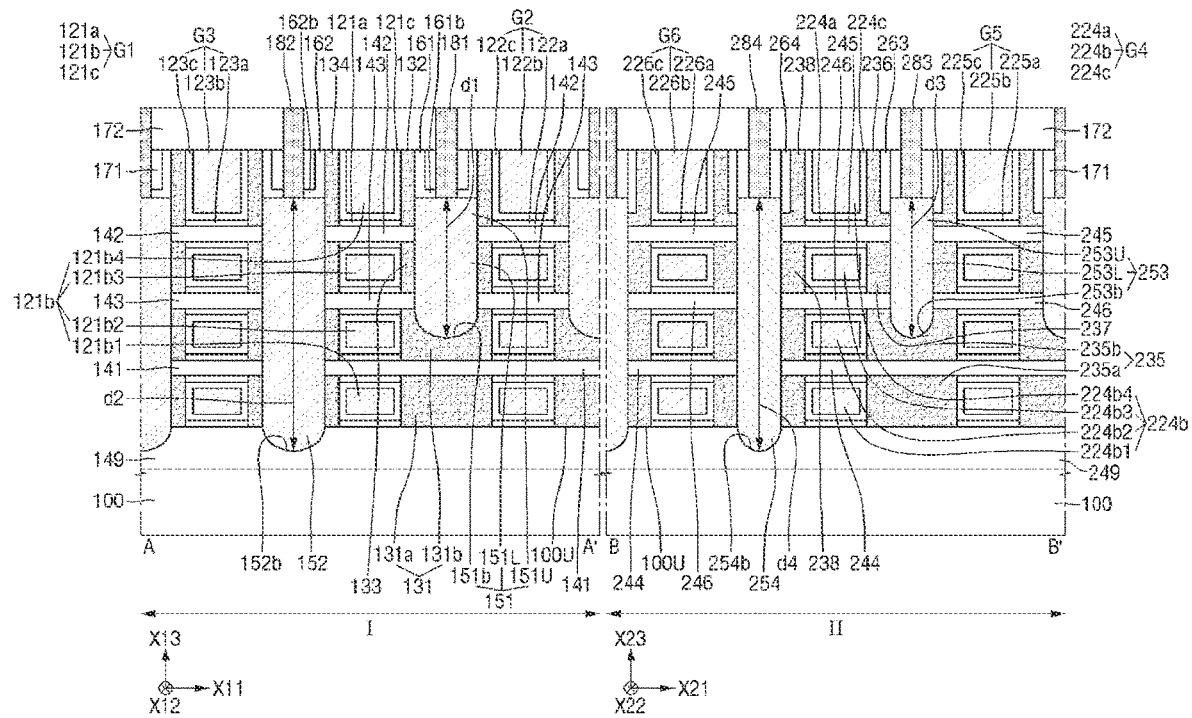
FIG. 2 is a cross-sectional view taken along the lines A-A' and B-B' of FIG. 1 according to some embodiments of the present inventive concepts.

In some embodiments, the first and second spacer materials 130 and 230 may include the same material as the material included in the first to eighth spacers 131, 132, 133, 134, 235, 236, 237 and 238 described with reference to FIG. 2.

Figure 11:
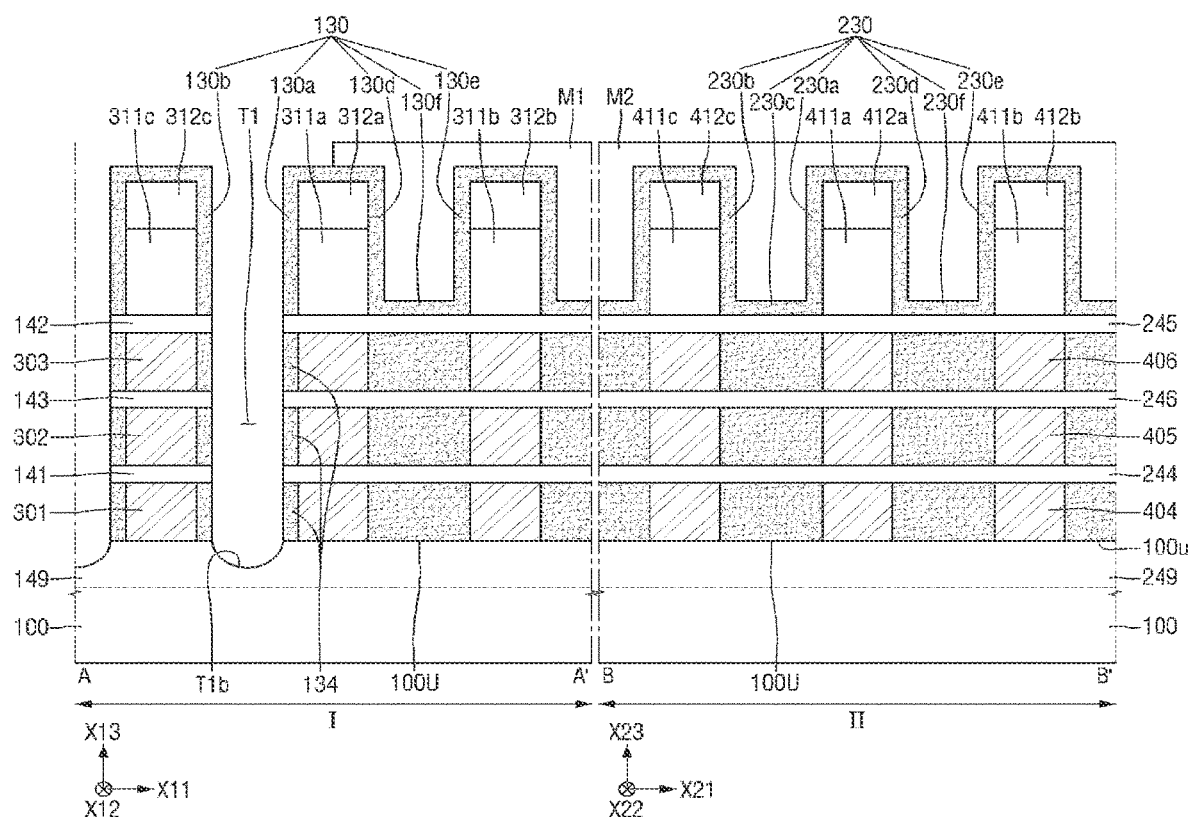

Referring to FIG. 11, a first trench T1 may be formed in the first region I of the substrate 100. During formation of the first trench T1, a part of the first dummy gate electrode 311a, a part of the first hard mask 312a, the fourth portion 130d of the first spacer material 130, the fifth portion 130e of the first spacer material 130, the sixth portion 130f of the first spacer material 130, the second dummy gate electrode 311b, and the second hard mask 312b may be covered with the first mask M1. Also, during formation of the first trench T1, the second region II of the substrate 100 may be covered with the second mask M2.

The first trench T1 may be formed between the first dummy gate electrode 311a and the third dummy gate electrode 311c. The first trench T1 may be formed by removal of portions of first to third wire patterns 141, 142 and 143, the first spacer material 130 between the second and third wire patterns 142 and 143, the first spacer material 130 between the first and third wire patterns 141 and 143, and the first spacer material 130 between the first wire pattern 141 and the substrate 100, which the third portion 130c of the first spacer material 130 overlaps in the thirteenth direction X13. The side walls of the first trench T1 may be defined by the first to third wire patterns 141, 142 and 143 and the fourth spacer 134. The bottom surface T1b of the first trench T1 may be defined by the substrate 100. Portions of the first spacer material 130 overlapped by the first portion 130a of the first spacer material 130 in the thirteenth direction X13 may be exposed to the first trench T1 to form a fourth spacer 134.

Figure 12:
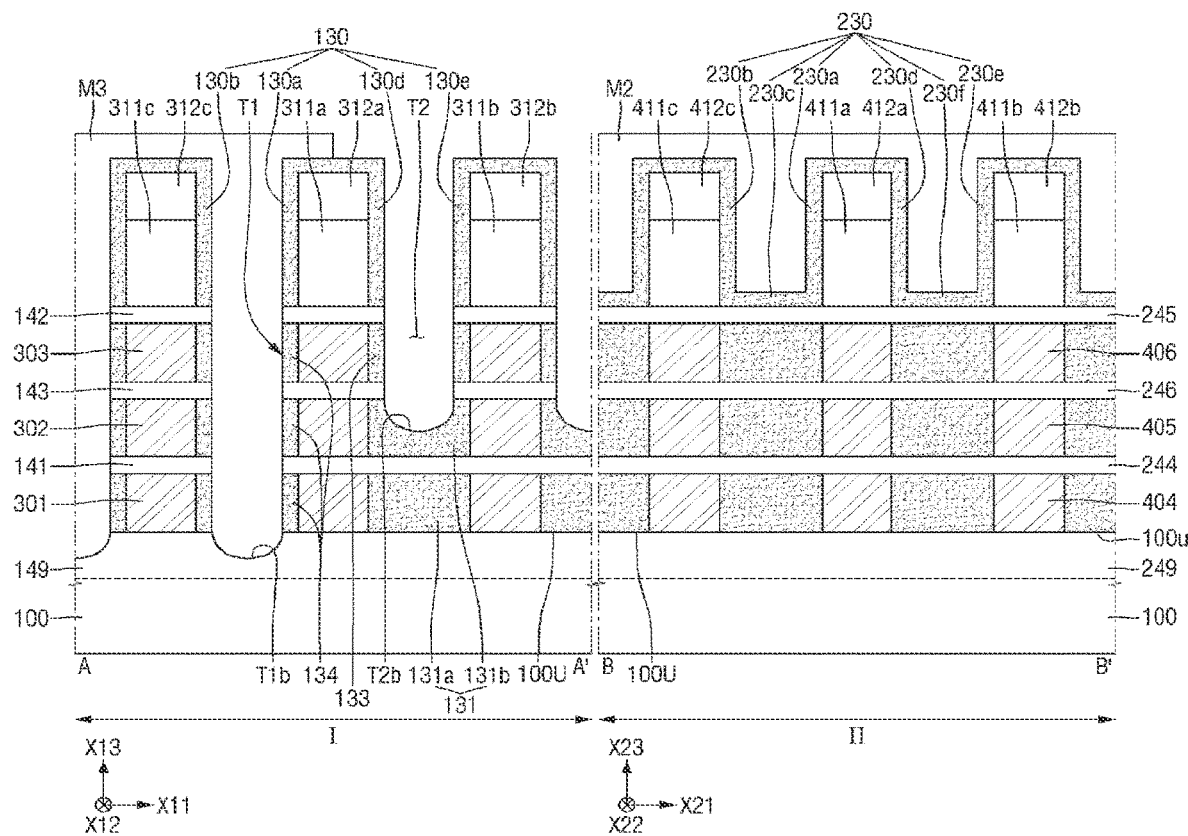

Referring to FIG. 12, a second trench T2 may be formed in the first region I of the substrate 100. After the first trench T1 is formed, the first mask M1 may be removed. During formation of the second trench T2, a part of the first dummy gate electrode 311a, a part of the first hard mask 312a, the first portion 130a of the first spacer material 130, the second portion 130b of the first spacer material 130, the third dummy gate electrode 311c and the third hard mask 312c may be covered with the third mask M3. The third mask M3 may fill the first trench T1.

The second trench T2 may be formed between the first and second dummy gate electrodes 311a and 311b. The second trench T2 may be formed by removal of some parts of the second and third wire patterns 142 and 143, the first spacer material 130 between the second and third wire patterns 142 and 143, and the first spacer material 130 between the first and third wire patterns 141 and 143, which the sixth portion 130f of the first spacer material 130 overlaps in the thirteenth direction X13. At least a part of the side wall of the second trench T2 may be defined by the second and third wire patterns 142 and 143 and the third spacer 133. The bottom surface T2b of the second trench T2 may be defined by the second portion 131b of the first spacer 131.

The second spacer material 130 overlapped by the fourth portion 130d of the first spacer material 130 in the thirteenth direction X13 may be exposed to the second trench T2 to form the third spacer 133. The first portion 131a and the second portion 131b of the first spacer 131 may be formed by the second trench T2.

Figure 13:
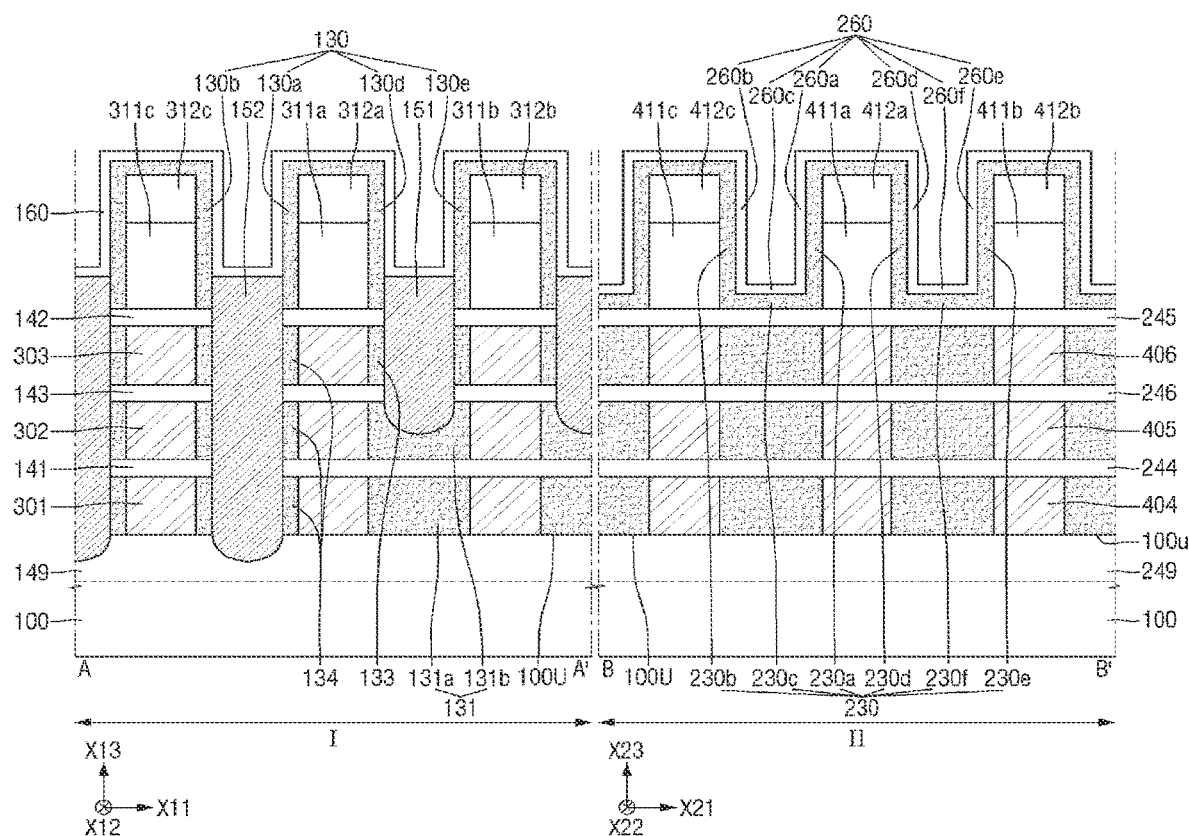

Referring to FIG. 13, the second mask M2 and the third mask M3 may be removed. The first and second source/drain regions 151 and 152 may be formed in the second and first trenches T2 and T1, respectively.

The third spacer material 160 may cover the first region I of the substrate 100 after the first and second source/drain regions 151 and 152 are formed. The fourth spacer material 260 may cover the second region II of the substrate 100. For example, the fourth spacer material 260 may be formed on the second spacer material 230. The fourth spacer material 260 may include first to sixth portions 260a, 260b, 260c, 260d, 260e and 260f. The first portion 260a of the fourth spacer material 260 may be a portion formed on one side wall of the fourth dummy gate electrode 411a and one side wall of the fourth hard mask 412a. The second portion 260b of the fourth spacer material 260 may be a portion formed on the other side wall of the sixth dummy gate electrode 411c and the other side wall of the sixth hard mask 412c. The third portion 260c of the fourth spacer material 260 may be a portion that extends along the upper surface of the fifth wire pattern 245 between the first and second portions 260a and 260b. The fourth portion 260d of the fourth spacer material 260 may be a portion formed on the other side wall of the fourth dummy gate electrode 411a and the other side wall of the fourth hard mask 412a. The fifth portion 260e of the fourth spacer material 260 may be a portion formed on one side wall of the fifth dummy gate electrode 411b and one side wall of the fifth hard mask 412b. The sixth portion 260f of the fourth spacer material 260 may be a portion that extends along the upper surface of the fifth wire pattern 245 between the fourth and fifth portions 260d and 260e. In some embodiments, the third and fourth spacer materials 160 and 260 may include the same material as those included in the ninth to twelfth spacers 161, 162, 263 and 264 described referring to FIG. 2.

Figure 14:
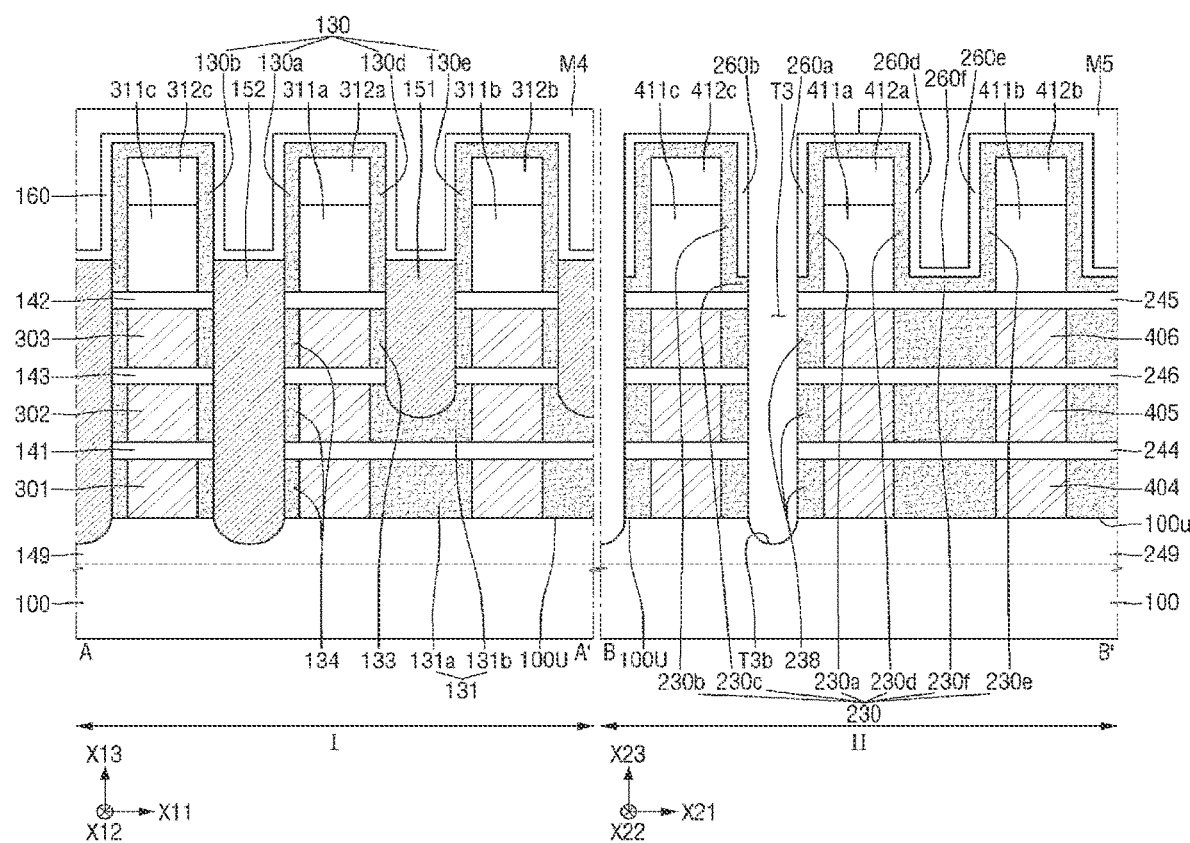

Referring to FIG. 14, a third trench T3 may be formed in the second region II of the substrate 100. During the formation of the third trench T3, a part of the fourth dummy gate electrode 411a, a part of the fourth hard mask 412a, the fourth portion 260d of the fourth spacer material 260, the fifth portion 260e of the fourth spacer material 260, the sixth portion 260f of the fourth spacer material 260, the fifth dummy gate electrode 411b and the fifth hard mask 412b may be covered with a fifth mask M5. Also, during formation of the third trench T3, the first region I of the substrate 100 may be covered with the fourth mask M4.

The third trench T3 may be formed between the fourth dummy gate electrode 411a and the sixth dummy gate electrode 411c. The third trench T3 may be formed by removal of portions of the fourth, fifth, and sixth wire patterns 244, 245, and 246, the fourth spacer material 260 between the fourth and sixth wire patterns 244 and 246, the fourth spacer material 260 between the fifth and sixth wire patterns 245 and 246, and the fourth spacer material 260 between the fourth wire pattern 244 and the substrate 100, which the third portion 260c of the fourth spacer material 260 overlaps in the twenty-third direction X23. The side walls of the third trench T3 may be defined by the fourth to sixth wire patterns 244, 245 and 246 and the eighth spacer 238. The bottom surface T3b of the third trench T3 may be defined by the substrate 100. The fourth spacer material 260 overlapped by the first portion 260a of the fourth spacer material 260 in the twenty-third direction X23 may be exposed to the third trench T3 to form an eight spacer 238.

Figure 15:
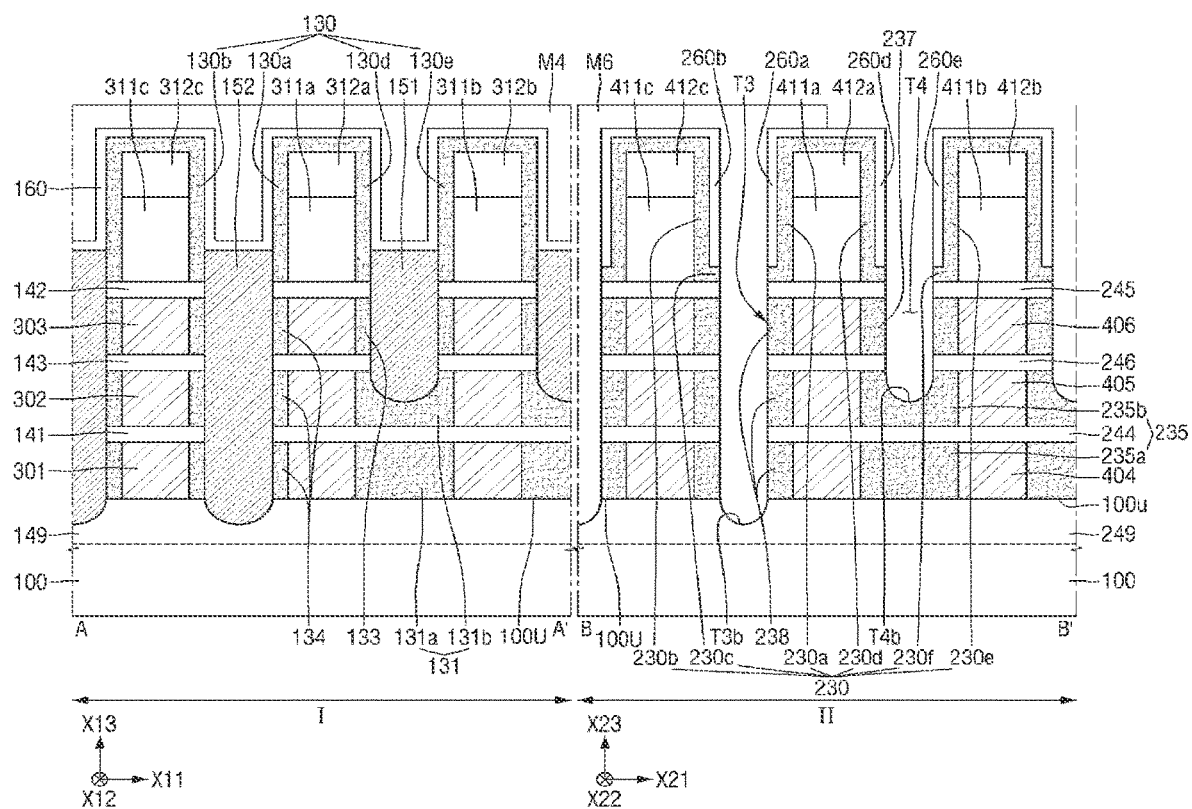

Referring to FIG. 15, a fourth trench T4 may be formed in the second region II of the substrate 100. After the third trench T3 is formed, the fifth mask M5 may be removed. During formation of the fourth trench T4, a part of the fourth dummy gate electrode 411a, a part of the fourth hard mask 412a, the first portion 260a of the fourth spacer material 260, the second portion 260b of the fourth spacer material 260, the sixth dummy gate electrode 411c, and the sixth hard mask 412c may be covered with the sixth mask M6. The sixth mask M6 may fill the third trench T3.

The fourth trench T4 may be formed between the fourth dummy gate electrode 411a and the fifth dummy gate electrode 411b. The fourth trench T4 may be formed by removal of some parts of the fifth and sixth wire patterns 245 and 246, the fourth spacer material 260 between the fifth and sixth wire pattern 245 and 246, and the sixth portion 230f of the second spacer material 230, which the sixth portion 260f of the fourth spacer material 260 overlaps in the twenty-third direction X23. At least a part of the side wall of the fourth trench T4 may be defined by the fifth and sixth wire patterns 245 and 246 and the seventh spacer 237. The bottom surface T4b of the fourth trench T4 may be defined by the second portion 235b of the fifth spacer 235. The fourth spacer material 260 overlapped by the fourth portion 260d of the fourth spacer material 260 in the twenty-third direction X23 may be exposed to the fourth trench T4 to form a seventh spacer 237. The first and second portions 235a and 235b of the fifth spacer 235 may be formed by the fourth trench T4.

Figure 16:
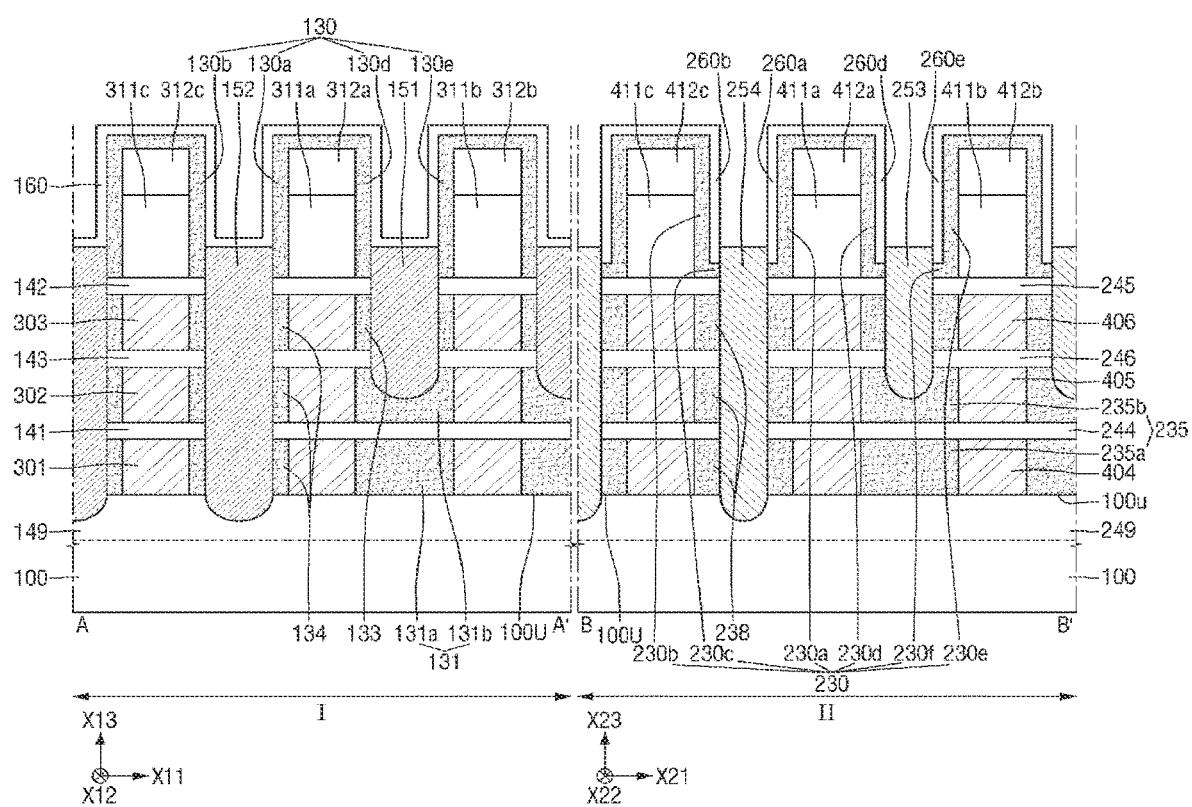

Referring to FIG. 16, the fourth and sixth masks M4 and M6 may be removed. The third and fourth source/drain regions 253 and 254 may be formed in the fourth and third trenches T4 and T3, respectively.

Figure 17:
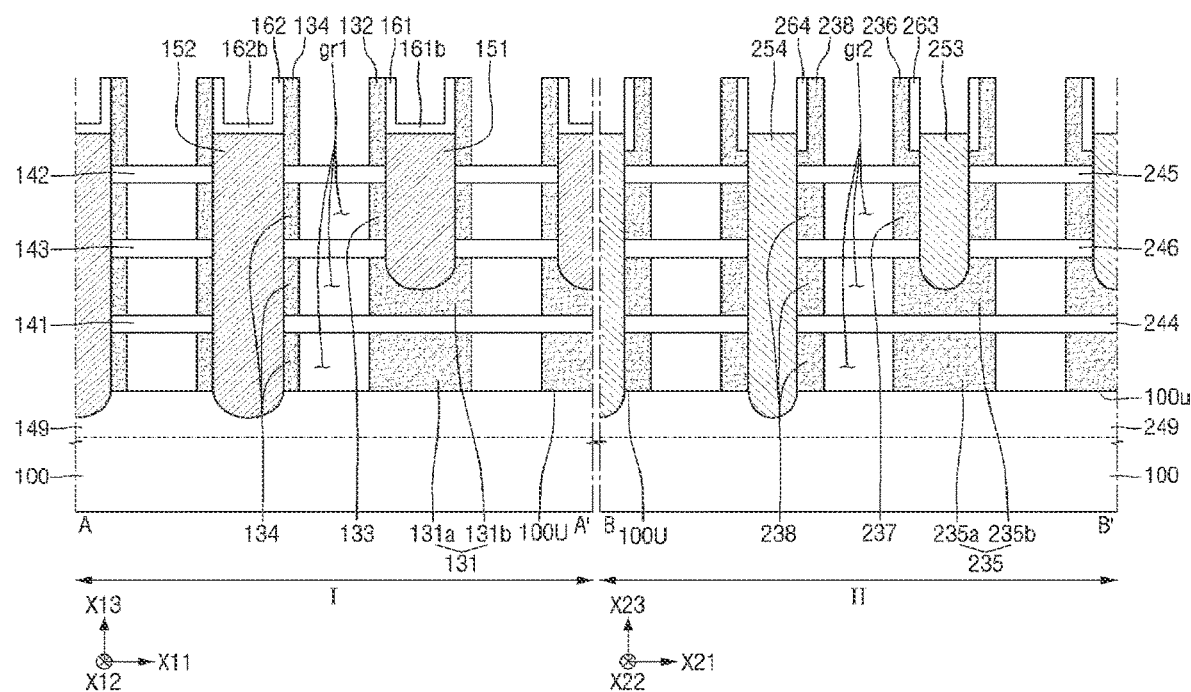

Referring to FIG. 17, the first to sixth hard masks 312a, 312b, 312c, 412a, 412b and 412c may be removed by, for example, a planarization process. At this time, the first to fourth spacer materials 130, 230, 160 and 260 formed on the upper surfaces and the side walls of each of the first to sixth hard masks 312a, 312b, 312c, 412a, 412b and 412c may also be removed. Further, the first to sixth hard masks 312a, 312b, 312c, 412a, 412b and 412c are removed, and the exposed first to sixth dummy gate electrodes 311a, 311b, 311c, 412a, 412b and 412c may be removed. First and second gate recesses gr1 and gr2 may be formed by removal of the remaining first to sixth sacrificial films 301, 302, 303, 404, 405 and 406.

With removal of the first to third hard masks 312a, 312b and 312c and the first to third dummy gate electrodes 311a, 311b and 311c, second and fourth spacers 132 and 134 on the second wire pattern 142, a ninth spacer 161 on the first source/drain region 151, and a tenth spacer 162 on the second source/drain region 152 may be defined. With removal of the fourth to sixth hard masks 412a, 412b and 412c and the fourth to sixth dummy gate electrodes 411a, 411b and 411c, sixth and eighth spacer 236 and 238 on the fifth wire pattern 245, an eleventh spacer 263 on the third source/drain region 253, and a twelfth spacer 264 on the fourth source/drain region 254 may be defined. The first to third gate structures G1, G2 and G3 may be formed in the first gate recess gr1, and the fourth to sixth gate structures G4, G5 and G6 may be formed in the second gate recess gr2.

Semiconductor devices formed in the first region I of the substrate 100 of FIG. 5 and the second region II of the substrate 100 of FIG. 6 may be formed, by removing the first and second spacer materials 130 and 230, using first to fourth trenches T1, T2, T3 and T4 or using the first and second gate recesses gr1 and gr2, as needed.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope is to be determined by the broadest permissible interpretation of the following claims and their equivalents, and shall not be restricted or limited by the foregoing detailed description.

What is claimed is:

1. A semiconductor device comprising:
a substrate including a first region and a second region, the first and second regions including different types of transistors;
a first wire pattern extending in a first direction on the first region of the substrate;
a second wire pattern on the first wire pattern, wherein the second wire pattern is spaced apart from the first wire pattern and extends in the first direction;
a first gate structure at least partially surrounding the first wire pattern and the second wire pattern;
a second gate structure spaced apart from the first gate structure in the first direction;
a first source/drain region between the first gate structure and the second gate structure;
a first source/drain contact on the first source/drain region;
a first spacer between the first source/drain contact and the first gate structure;
a second spacer between a bottom surface of the first source/drain region and the substrate;
a third wire pattern extending in a second direction on the second region of the substrate;
a fourth wire pattern on the third wire pattern, wherein the fourth wire pattern is spaced apart from the third wire pattern and extends in the second direction;
a third gate structure at least partially surrounding the third wire pattern and the fourth wire pattern;
a fourth gate structure spaced apart from the third gate structure in the second direction;
a second source/drain region between the third gate structure and the fourth gate structure;
a second source/drain contact on the second source/drain region;
a third spacer between the second source/drain contact and the third gate structure; and a fourth spacer between a bottom surface of the second source/drain region and the substrate, wherein the third spacer comprises a first portion extending along a side wall of the third gate structure and a second portion between the first portion and the second source/drain region, and wherein the second portion of the third spacer extends along an upper surface of the fourth wire pattern and does not extend to an upper surface of the first portion of the third spacer.

2. The semiconductor device of claim 1, wherein the first portion of the third spacer does not contact the second source/drain region.

3. The semiconductor device of claim 1, wherein the second portion of the third spacer contacts the second source/drain region.

4. The semiconductor device of claim 1, wherein a width of the first portion of the third spacer in the second direction is same as a width of the first spacer in the first direction.

5. The semiconductor device of claim 1, further comprising:
a fifth spacer disposing between the third wire pattern and the fourth wire pattern,
wherein a width of the fifth spacer in the second direction is greater than a width of the first portion of the third spacer in the second direction.

6. The semiconductor device of claim 5, wherein the width of the fifth spacer in the second direction is greater than a width of the first spacer in the first direction.

7. The semiconductor device of claim 5, wherein the width of the fifth spacer in the second direction is equal to a sum of the width of the first portion of the third spacer in the second direction and a width of the second portion of the third spacer in the second direction.

8. The semiconductor device of claim 1, further comprising:
a fifth gate structure in the first region of the substrate, wherein the fifth gate structure is spaced apart from the first and second gate structure in the first direction and at least partially surrounds the first and second wire patterns; and
a third source/drain region that is between the first gate structure and the fifth gate structure and extends through the first and second wire patterns,
wherein a first depth from an upper surface of the first source/drain region to the bottom surface of the first source/drain region is smaller than a second depth from an upper surface of the third source/drain region to a bottom surface of the third source/drain region.

9. The semiconductor device of claim 8, further comprising:
a sixth gate structure in the second region of the substrate, wherein the sixth gate structure is spaced apart from the third and fourth gate structure in the second direction and at least partially surrounds the third and fourth wire patterns; and
a fourth source/drain region that is between the third gate structure and the sixth gate structure and extends through the third and fourth wire patterns,
wherein a third depth from an upper surface of the second source/drain region to the bottom surface of the second source/drain region is smaller than a fourth depth from an upper surface of the fourth source/drain region to a bottom surface of the fourth source/drain region.

10. The semiconductor device of claim 1, wherein the first to fourth spacers include the same material.

11. A semiconductor device comprising:
a substrate including a first region and a second region, the first and second regions including different types of transistors;
a first wire pattern extending in a first direction on the first region of the substrate;
a second wire pattern on the first wire pattern, wherein the second wire pattern is spaced apart from the first wire pattern and extends in the first direction;
a first gate structure at least partially surrounding the first wire pattern and the second wire pattern;
a second gate structure spaced apart from the first gate structure in the first direction;
a third wire pattern extending in a second direction on the second region of the substrate;
a fourth wire pattern on the third wire pattern, wherein the fourth wire pattern is spaced apart from the third wire pattern and extends in the second direction;
a third gate structure at least partially surrounding the third wire pattern and the fourth wire pattern;
a fourth gate structure spaced apart from the third gate structure in the second direction;
a first source/drain region between the first gate structure and the second gate structure;
a first spacer between a side wall of the first source/drain region and the first gate structure;
a second spacer between a bottom surface of the first source/drain region and the substrate;
a second source/drain region between the third gate structure and the fourth gate structure;
a third spacer between a side wall of the second source/drain region and the third gate structure; and
a fourth spacer between a bottom surface of the second source/drain region and the substrate,
wherein a width of the first spacer in the first direction is smaller than a width of the third spacer in the second direction.

12. The semiconductor device of claim 11, wherein the first to fourth spacers include the same material.

13. The semiconductor device of claim 11, further comprising:
a fifth gate structure in the first region of the substrate, wherein the fifth gate structure is spaced apart from the first and second gate structure in the first direction and at least partially surrounds the first and second wire patterns; and
a third source/drain region that is between the first gate structure and the fifth gate structure and extends through the first and second wire patterns,
wherein a first depth from an upper surface of the first source/drain region to the bottom surface of the first source/drain region is smaller than a second depth from an upper surface of the third source/drain region to a bottom surface of the third source/drain region.

14. The semiconductor device of claim 13, further comprising:
a sixth gate structure in the second region of the substrate, wherein the sixth gate structure is spaced apart from the third and fourth gate structure in the second direction and at least partially surrounds the third and fourth wire patterns; and
a fourth source/drain region that is between the third gate structure and the sixth gate structure and extends through the third and fourth wire patterns,
wherein a third depth from an upper surface of the second source/drain region to the bottom surface of the second source/drain region is smaller than a fourth depth from an upper surface of the fourth source/drain region to a bottom surface of the fourth source/drain region.

\* \* \* \* \*